(12) United States Patent
Lang et al.

(10) Patent No.: US 11,018,728 B2
(45) Date of Patent: May 25, 2021

(54) TRANSMISSION PHASE MEASUREMENT AND CALIBRATION METHOD UTILIZING HIGHER-ORDER FREQUENCY BINS

(71) Applicant: Infineon Technologies AG, Neubiberg (DE)

(72) Inventors: Oliver Lang, Linz (AU); Werner Arriola, Linz (AU); Vincenzo Fiore, Linz (AT); Alexander Melzer, Neutillmitsch (AT)

(73) Assignee: Infineon Technologies AG

( * ) Notice: Subject to any disclaimer, the term of this patent is extended or adjusted under 35 U.S.C. 154(b) by 0 days.

(21) Appl. No.: 16/423,499

(22) Filed: May 28, 2019

(65) Prior Publication Data

US 2020/0382170 A1 Dec. 3, 2020

(51) Int. Cl.
*H04B 7/0408* (2017.01)
*H04B 1/48* (2006.01)
*H03M 1/12* (2006.01)
*G01S 13/82* (2006.01)
*G01S 13/34* (2006.01)
*G01S 7/40* (2006.01)

(52) U.S. Cl.
CPC .......... *H04B 7/0408* (2013.01); *G01S 7/4056* (2013.01); *G01S 13/343* (2013.01); *G01S 13/825* (2013.01); *H03M 1/12* (2013.01); *H04B 1/48* (2013.01)

(58) Field of Classification Search
CPC .......... H04B 7/0408; H04B 1/46; H04B 1/48; H04B 10/616; H03M 1/12; G01S 7/4056; G01S 13/343; G01S 13/825
See application file for complete search history.

(56) References Cited

U.S. PATENT DOCUMENTS

| 2006/0034365 | A1* | 2/2006 | Song | H03F 1/3223 |
| | | | | 375/238 |
| 2010/0135378 | A1* | 6/2010 | Lin | H04L 7/0331 |
| | | | | 375/233 |
| 2017/0031005 | A1* | 2/2017 | Jaeger | G01S 7/35 |
| 2019/0154797 | A1* | 5/2019 | Subburaj | G01S 7/4004 |

FOREIGN PATENT DOCUMENTS

CN 102422571 B * 6/2016 ........... H04B 10/616

\* cited by examiner

*Primary Examiner* — Phirin Sam
*Assistant Examiner* — Louis Samara
(74) *Attorney, Agent, or Firm* — Design IP

(57) ABSTRACT

A circuit includes a transmission channel that outputs a continuous-wave signal based on a reference signal, a transmit monitoring signal path that couples out a portion of the transmit signal as a monitoring signal, a test phase shifter that receives the reference signal and generates a phase-shifted signal based on a sequence of phase offsets applied to the reference signal, a phase mixer that mixes the phase-shifted signal and the monitoring signal to generate a mixer output signal including a plurality of direct current (DC) values, an analog-to-digital converter that samples the mixer output signal in order to provide a sequence of DC values; and a monitor circuit that applies a discrete Fourier transform (DFT) to the sequence of DC values to generate a plurality of DFT bins with corresponding DFT bin values, and generate compensated phase information of the transmission channel using at least two DFT bin values.

22 Claims, 15 Drawing Sheets

$$s_{oc,0}[k] = \left( A_{TX01}\cos(\varphi_{TSG}[k]-\varphi_{TX01}-0) + A_{TX02}\cos(\varphi_{TSG}[k]-\varphi_{TX02}-0) + \ldots + A_{TXn}\cos(\varphi_{TSG}[k]-\varphi_{TXn}-0) \right)$$

$$s_{oc,1}[k] = \left( \boxed{A_{TX01}\cos(\varphi_{TSG}[k]-\varphi_{TX01}-0)} + A_{TX02}\cos(\varphi_{TSG}[k]-\varphi_{TX02}-\pi) + \ldots + A_{TXn}\cos(\varphi_{TSG}[k]-\varphi_{TXn}-\pi) \right)$$

$$s_{oc,2}[k] = \left( A_{TX01}\cos(\varphi_{TSG}[k]-\varphi_{TX01}-\pi) + \boxed{A_{TX02}\cos(\varphi_{TSG}[k]-\varphi_{TX02}-0)} + \ldots + A_{TXn}\cos(\varphi_{TSG}[k]-\varphi_{TXn}-\pi) \right)$$

$$\vdots$$

$$s_{oc,n}[k] = \left( A_{TX01}\cos(\varphi_{TSG}[k]-\varphi_{TX01}-\pi) + A_{TX02}\cos(\varphi_{TSG}[k]-\varphi_{TX02}-\pi) + \ldots + \boxed{A_{TXn}\cos(\varphi_{TSG}[k]-\varphi_{TXn}-0)} \right)$$

Fig. 10A $$M_{o1}[k] = \left( s_{oc,0}[k] + s_{oc,1}[k] \right) = A_{TX01}\cos(\varphi_{TSG}[k]-\varphi_{TX01})$$

$$M_{o2}[k] = \left( s_{oc,0}[k] + s_{oc,2}[k] \right) = A_{TX02}\cos(\varphi_{TSG}[k]-\varphi_{TX02})$$

$$\vdots$$

$$M_{on}[k] = \left( s_{oc,0}[k] + s_{oc,n}[k] \right) = A_{TX02}\cos(\varphi_{TSG}[k]-\varphi_{TXn})$$

Fig. 10B $$S_{oc,0}[k] = \Big( A_{Tx01}\cos(\varphi_{TSG}[k]-\varphi_{Tx01}-0) + A_{Tx02}\cos(\varphi_{TSG}[k]-\varphi_{Tx02}-0) + \ldots + A_{Txn}\cos(\varphi_{TSG}[k]-\varphi_{Txn}-0) \Big)$$

$$S_{oc,1}[k] = \Big( A_{Tx01}\cos(\varphi_{TSG}[k]-\varphi_{Tx01}-\pi) + A_{Tx02}\cos(\varphi_{TSG}[k]-\varphi_{Tx02}-0) + \ldots + A_{Txn}\cos(\varphi_{TSG}[k]-\varphi_{Txn}-0) \Big)$$

$$S_{oc,2}[k] = \Big( A_{Tx01}\cos(\varphi_{TSG}[k]-\varphi_{Tx01}-0) + A_{Tx02}\cos(\varphi_{TSG}[k]-\varphi_{Tx02}-\pi) + \ldots + A_{Txn}\cos(\varphi_{TSG}[k]-\varphi_{Txn}-0) \Big)$$

$$\vdots$$

$$S_{oc,n}[k] = \Big( A_{Tx01}\cos(\varphi_{TSG}[k]-\varphi_{Tx01}-0) + A_{Tx02}\cos(\varphi_{TSG}[k]-\varphi_{Tx02}-0) + \ldots + A_{Txn}\cos(\varphi_{TSG}[k]-\varphi_{Txn}-\pi) \Big)$$

Fig. 11A $$M_{o1}[k] = \Big(S_{oc,0}[k] - S_{oc,1}[k]\Big) = A_{Tx01}\cos(\varphi_{TSG}[k]-\varphi_{Tx01})$$

$$M_{o2}[k] = \Big(S_{oc,0}[k] - S_{oc,2}[k]\Big) = A_{Tx02}\cos(\varphi_{TSG}[k]-\varphi_{Tx02})$$

$$\vdots$$

$$M_{on}[k] = \Big(S_{oc,0}[k] - S_{oc,n}[k]\Big) = A_{Txn}\cos(\varphi_{TSG}[k]-\varphi_{Txn})$$

Fig. 11B

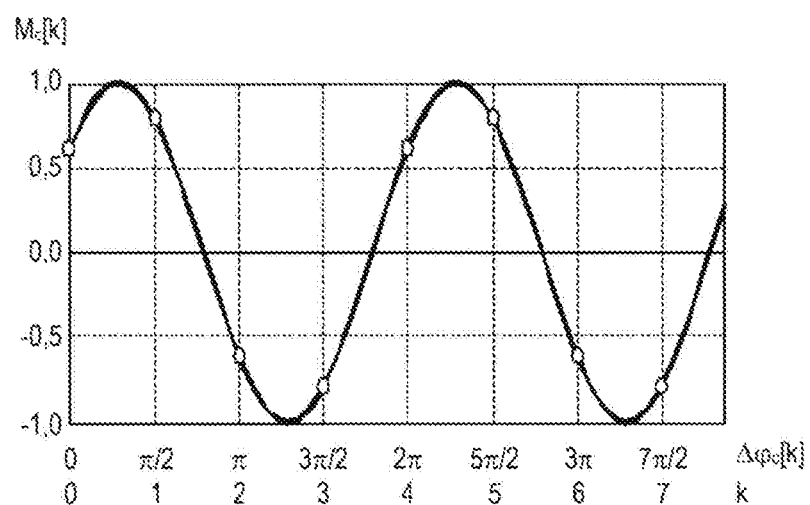
Fig. 15A
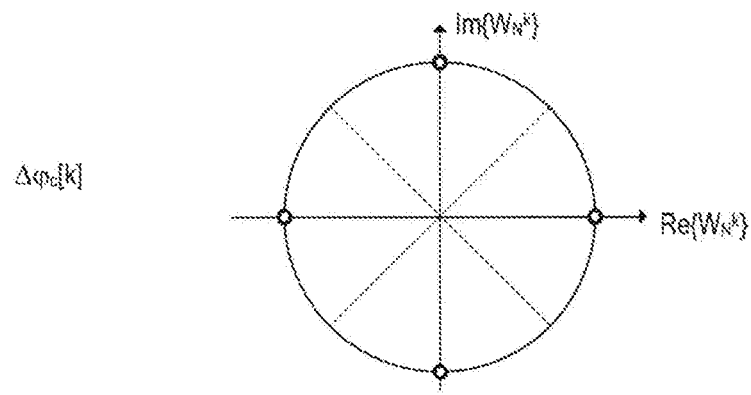
Fig. 15B
| k | 0 | 1 | 2 | 3 | 4 | 5 | 6 | 7 |
|---|---|---|---|---|---|---|---|---|
| $\Delta\varphi_d[k]$ | 0<br>0 | $\pi/2$<br>90° | $\pi$<br>180° | $3\pi/2$<br>270° | $2\pi$<br>360° | $5\pi/2$<br>450° | $3\pi$<br>540° | $7\pi/2$<br>630° |
| $\varphi_{TSG}[k]$ | 0<br>0 | $\pi/2$<br>90° | $\pi$<br>180° | $3\pi/2$<br>270° | $2\pi$<br>360° | $5\pi/2$<br>450° | $3\pi$<br>540° | $7\pi/2$<br>630° |
| $\Delta\varphi_{TXd}[k]$ | 0<br>0 | 0<br>0 | 0<br>0 | 0<br>0 | 0<br>0 | 0<br>0 | 0<br>0 | 0<br>0 |
Fig. 16

| k | 0 | 1 | 2 | 3 | 4 | 5 | 6 | 7 |
|---|---|---|---|---|---|---|---|---|
| $\Delta\varphi_c[k]$ | 0 / 0 | $\pi/2$ / 90° | $\pi$ / 180° | $3\pi/2$ / 270° | $2\pi$ / 360° | $5\pi/2$ / 450° | $3\pi$ / 540° | $7\pi/2$ / 630° |
| $\varphi_{TSC}[k]$ | 0 / 0 | $\pi/2$ / 90° | $\pi$ / 180° | $3\pi/2$ / 270° | $\pi/4$ / 45° | $3\pi/4$ / 135° | $5\pi/4$ / 225° | $7\pi/4$ / 315° |
| $\Delta\varphi_{TXd}[k]$ | 0 / 0 | 0 / 0 | 0 / 0 | 0 / 0 | $\pi/4$ / 45° | $\pi/4$ / 45° | $\pi/4$ / 45° | $\pi/4$ / 45° |

Fig. 17

TRANSMISSION PHASE MEASUREMENT AND CALIBRATION METHOD UTILIZING HIGHER-ORDER FREQUENCY BINS

FIELD

The present disclosure relates to the field of radio frequency (RF) circuits, and particularly to a multi-channel RF circuits with multiple RF output channels.

BACKGROUND

Modern radar devices such as radar range and velocity sensors can be integrated in so-called monolithic microwave integrated circuits (MMICs). Radar sensors may be applied, for example, in the automotive sector, where they are used in so-called advanced driver assistance systems (ADAS) such as, for example, "adaptive cruise control" (ACC) or "radar cruise control" systems. Such systems may be used to automatically adjust the speed of an automobile so as to maintain a safe distance from other automobiles travelling ahead. However, RF circuits are also used in many other fields such as RF communication systems.

A radar MMIC (sometimes referred to as single chip radar) may incorporate all core functions of the RF frontend of a radar transceiver (e.g., local oscillator, power amplifiers, low-noise amplifiers (LNA), mixers, etc.), the analog pre-processing of the intermediate frequency (IF) or base band signals (e.g., filters, amplifiers, etc.), and the analog-to-digital conversion in one single package. The RF frontend usually includes multiple reception and transmission channels, particularly in applications in which beam steering techniques, phased antenna arrays, etc. are used. In radar applications, phased antenna arrays may be employed to sense the incidence angle of incoming RF radar signals (also referred to as "Direction of Arrival", DOA).

For example, when using a phased antenna array to radiate a radar signal, the phase shift and/or amplitude gain caused by each output channel needs to be known.

SUMMARY

Embodiments provide a method for and a device for transmission phase measurements and calibration.

One or more embodiments provide a circuit that includes a transmission channel configured to output a continuous-wave signal based on a reference signal; a transmit monitoring signal path configured to couple out a portion of the transmit signal as a transmit monitoring signal; a test phase shifter configured to receive the reference signal and generate a phase-shifted signal based on a sequence of phase offsets applied to the reference signal; a phase mixer configured to mix the phase-shifted signal and the transmit monitoring signal to generate a mixer output signal including a plurality of direct current (DC) values; an analog-to-digital converter (ADC) configured to sample the mixer output signal in order to provide a sequence of DC sample values; and a monitor circuit configured to apply a discrete Fourier transform (DFT) to the sequence of DC sample values to generate a plurality of DFT bins with corresponding DFT bin values, and use at least two DFT bin values to generate compensated phase information of the transmission channel.

One or more embodiments provide a method of measuring a transmission phase. The method includes outputting a continuous-wave signal from a transmission channel based on a reference signal; coupling out a portion of the transmit signal as a transmit monitoring signal; generating a phase-shifted signal based on a sequence of phase offsets applied to the reference signal; mixing the phase-shifted signal and the transmit monitoring signal to generate a mixer output signal comprising a plurality of direct current (DC) values; sampling the mixer output signal in order to provide a sequence of DC sample values; apply a discrete Fourier transform (DFT) to the sequence of DC sample values to generate a plurality of DFT bins with corresponding DFT bin values; and generating compensated phase information of the transmission channel based on at least two DFT bin values.

BRIEF DESCRIPTION OF THE DRAWINGS

Embodiments are described herein making reference to the appended drawings.

FIGS. 10A and 10B show equations that illustrate one scheme, according to which phases of the RF output channels may be successively inverted during one measurement cycle in the RF circuit of FIG. 1.

FIGS. 11A and 11B show equations that illustrate an alternative scheme equivalent to the scheme of FIGS. 10A-10B, according to which the phases of the RF output channels may be successively inverted during one measurement cycle in the RF circuit of FIG. 1.

FIGS. 15A and 15B include diagrams illustrating a second example of a sequence of measured values and corresponding weight factors used for calculating a corresponding spectral value, respectively.

FIGS. 16 and 17 include tables with different phase shifter settings used when obtaining a sequence of measured values

DETAILED DESCRIPTION

Figure 1:
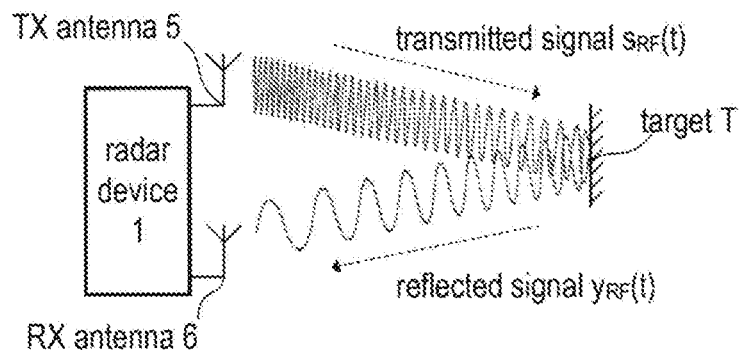
FIG. 1 is a drawing illustrating the operating principle of a frequency-modulated continuous-wave (FMCW) radar system for distance and/or velocity measurement.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and/or any other processes required to make a sensor output suitable for processing after conditioning.

Thus, a signal processing circuit may include analog circuitry and/or digital circuitry including an analog-to-digital converter (ADC) that converts the analog signal from the one or more sensor elements to a digital signal. The signal processing circuit may include a digital signal processor (DSP) that performs some processing on the digital signal.

Embodiments are discussed below in the context of a radar transmitter or transceiver. It should be noted, however, that the present invention may also be applied in applications different from radar such as, for example, RF transceivers of RF communication devices. In fact, almost any RF circuitry with multiple RF channels may take advantage of the concepts described herein.

FIG. 1 illustrates a frequency-modulated continuous-wave (FMCW) radar device 1. In the present example, separate transmission (TX) and reception (RX) antennas 5 and 6, respectively, are used. However, it is noted that a single antenna can be used so that the transmission antenna and the reception antenna are physically the same (monostatic radar configuration). The transmission antenna continuously radiates an RF signal sRF(t), which is frequency-modulated, for example, by a periodic linear frequency ramp signal (also referred to as frequency sweep or chirp signal). The transmitted signal sRF(t) is back-scattered at a target T, which is located in the radar channel within the measurement range of the radar device. The back-scattered signal yRF(t) is received by the reception antenna 6. In the depicted example, the back-scattered signal is denoted as yRF(t).

Figure 2:
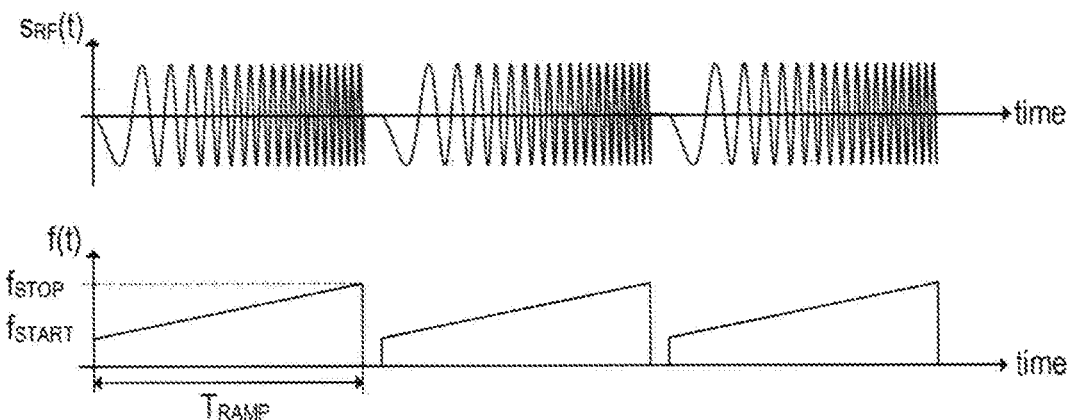
FIG. 2 includes two timing diagrams illustrating the frequency modulation of the radio frequency (RF) signal used in FMCW radar systems.

FIG. 2 illustrates the mentioned frequency-modulation of the signal $s_{RF}(t)$ according to one or more embodiments. As shown in the first diagram of FIG. 2, the signal $s_{RF}(t)$ may be composed of a series of "ramps", i.e., a sinusoidal waveform with increasing (up-chirp) or decreasing (down-chirp), separated by a short pause. Several ramps with short pauses in between make up a "chirp". Radar sends sequences of frames or data units during a single "ramp" which represents one radar measurement. In addition, there is a longer pause between chirps. In the present example, a single chirp composed of three ramps is shown. A long pause follows the third ramp, after which another chirp is started. Thus, each ramp includes a plurality of frames, and each chirp includes a plurality of ramps and a plurality of short pauses between ramps.

The instantaneous frequency f(t) of a ramp increases linearly from a start frequency $f_{START}$ to a stop frequency $f_{STOP}$ within a defined time span $T_{RAMP}$ (see second diagram of FIG. 2). Such a ramp is also referred to as a linear frequency ramp. Three identical linear frequency ramps are illustrated in FIG. 2. It is noted, however, that the parameters $f_{START}$, $f_{STOP}$, $T_{RAMP}$ as well as the pause between the individual frequency ramps may vary dependent on the actual implementation and use of the radar device 1. In practice, the frequency variation may be, for example, linear (linear ramp, frequency ramp), exponential (exponential ramp), or hyperbolic (hyperbolic ramp).

Figure 3:
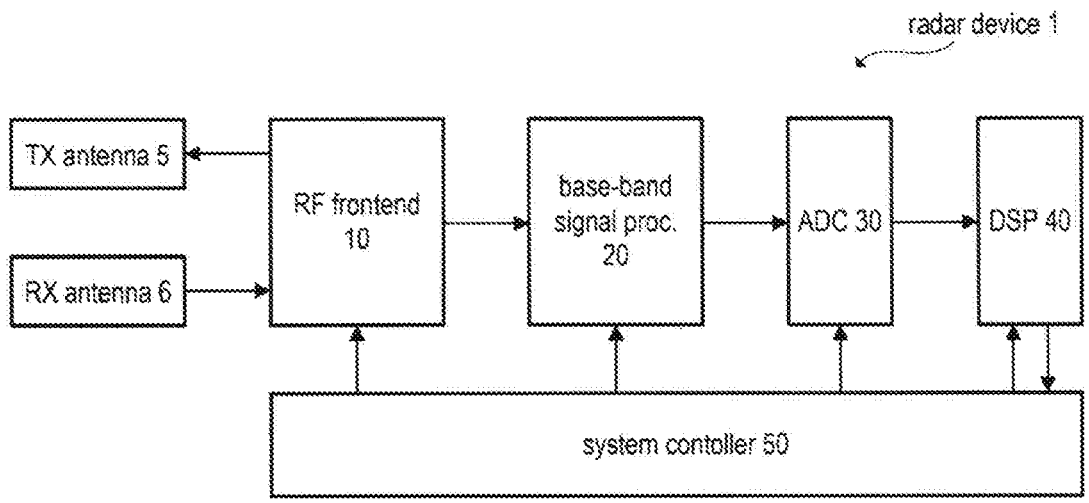
FIG. 3 is a block diagram illustrating the basic structure of an FMCW radar device.

FIG. 3 is a block diagram that illustrates an exemplary structure of a radar device 1 (radar sensor). It is noted that a similar structure may also be found in RF transceivers used in other applications such as, for example, in wireless communications systems. Accordingly, at least one transmission antenna 5 (TX antenna) and at least one reception antenna 6 (RX antenna) are connected to an RF frontend 10, which may be integrated in a monolithic microwave integrated circuit (MMIC). The RF frontend 10 may include all the circuit components needed for RF signal processing. Such circuit components may (but need not necessarily) include, for example, a local oscillator (LO), RF power amplifiers, low noise amplifiers (LNAs), directional couplers such as rat-race-couplers and circulators, and mixers for the down-conversion of RF signals (e.g., the received signal $y_{RF}(t)$, see FIG. 1) into the base-band or an intermediate frequency (IF) band. It is noted that antenna-arrays may be used instead of single antennas. The depicted example shows a bistatic (or pseudo-monostatic) radar system which has separate RX and TX antennas. In the case of a monostatic radar system, a single antenna or a single antenna array may be used to both receive and transmit electromagnetic (radar) signals. In this case, a directional coupler (e.g., a circulator) may be used to separate RF signals to be transmitted to the radar channel from RF signals received from the radar channel. In practice, radar systems often include several transmission (TX) and reception (RX) channels, which among others allows the measurement of the direction (direction of arrival (DoA)), from which the radar echoes are received.

In the case of a frequency-modulated continuous-wave (FMCW) radar system, the transmitted RF signals radiated by the TX antenna 5 are in the range between approximately 20 GHz (e.g., 24 GHz) and 100 GHz (e.g., 77 GHz in automotive applications). As mentioned, the RF signal $y_{RF}(t)$ received by the RX antenna 6 includes the radar echoes, i.e., the signal back-scattered at the so-called radar targets. The received RF signals $y_{RF}(t)$ are down-converted into the base band (or IF band) and further processed in the base band using analog signal processing (see FIG. 3, base-band signal processing chain 20), which basically includes filtering and amplification of the base-band signal. The base-band signal is finally digitized using one or more analog-to-digital converters (ADC) 30 and further processed in the digital domain (see FIG. 3, digital signal processing chain implemented, e.g., in digital signal processor, DSP, 40). The overall system is controlled by a system controller 50, which may be at least partly implemented using a processor, such as a microcontroller executing appropriate firmware. The RF frontend 10 and the analog base-band signal processing chain 20 (and optionally the ADC 30) may be integrated in a single MMIC. However, in some applications, some components may also be distributed among two or more integrated circuits.

Figure 4:
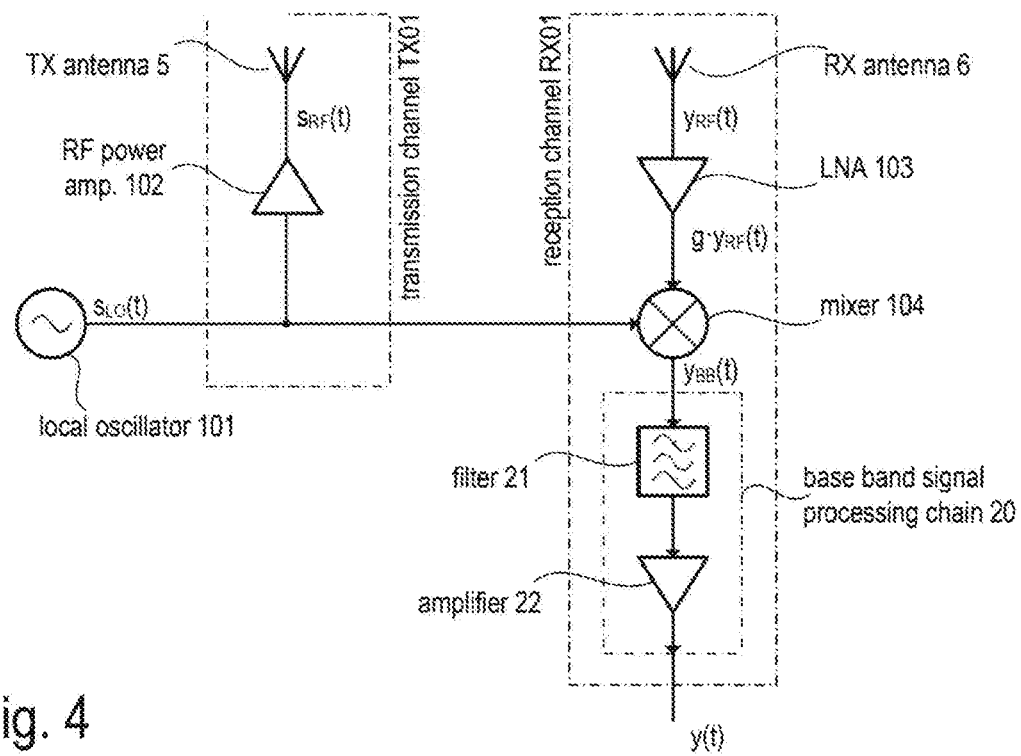
FIG. 4 is a circuit diagram illustrating one example of an analog RF frontend, which may be included in the FMCW radar device of FIG. 3.

FIG. 4 illustrated one exemplary implementation of the RF frontend 10, which may be included in the radar sensor shown in FIG. 3. It is noted that FIG. 4 is a simplified circuit diagram illustrating the basic structure of an RF frontend. Actual implementations, which may heavily depend on the application, are of course more complex and include several RX and/or TX channels. The RF frontend 10 includes a local oscillator 101 (LO) that generates a RF signal $s_{LO}(t)$, which may be frequency-modulated as explained above with reference to FIG. 2. The signal $s_{LO}(t)$ is also referred to as LO signal. In radar applications, the LO signal is usually in the SHF (Super High Frequency) or the EHF (Extremely High Frequency) band, e.g., between 76 GHz and 81 GHz in automotive applications.

The LO signal $s_{LO}(t)$ is processed in the transmission signal path as well as in the reception signal path. The transmission signal $s_{RF}(t)$ (outgoing radar signal), which is radiated by the TX antenna 5, is generated by amplifying the LO signal $s_{LO}(t)$, e.g., using an RF power amplifier 102. The output of the amplifier 102 is coupled to the TX antenna 5. The received signal $y_{RF}(t)$ (incoming radar signal), which is provided by the RX antenna 6, is directed to a mixer 104. In the present example, the received signal $y_{RF}(t)$ (i.e., the antenna signal) is pre-amplified by RF amplifier 103 (gain g), so that the mixer receives the amplified signal $g \, y_{RF}(t)$ at its RF input port. The mixer 104 further receives the LO signal $s_{LO}(t)$ at its reference input port and is configured to down-convert the amplified signal $g \, y_{RF}(t)$ into the base band. The resulting base-band signal at the mixer output is denoted as $y_{BB}(t)$. The base-band signal $y_{BB}(t)$ is further processed by the analog base band signal processing chain 20 (see also FIG. 3), which basically includes one or more filters (e.g., a band-pass 21) to remove undesired side bands and image frequencies as well as one or more amplifiers such as amplifier 22). The analog output signal, which may be supplied to an analog-to-digital converter (cf. FIG. 3), is denoted as y(t). Various techniques for the digital post-processing of the digitized output signals (digital radar signal) are as such known (e.g., Range Doppler Analysis) and thus not further explained herein.

In the present example, the mixer 104 down-converts the RF signal $gy_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). In view of the example of FIG. 4, it is clear that the quality of the radar measurement will heavily depend on the quality of the LO signal $s_{LO}(t)$. Low phase noise, as well as steep and highly linear frequency ramps are desired properties of the LO signal $s_{LO}(t)$.

Figure 5:
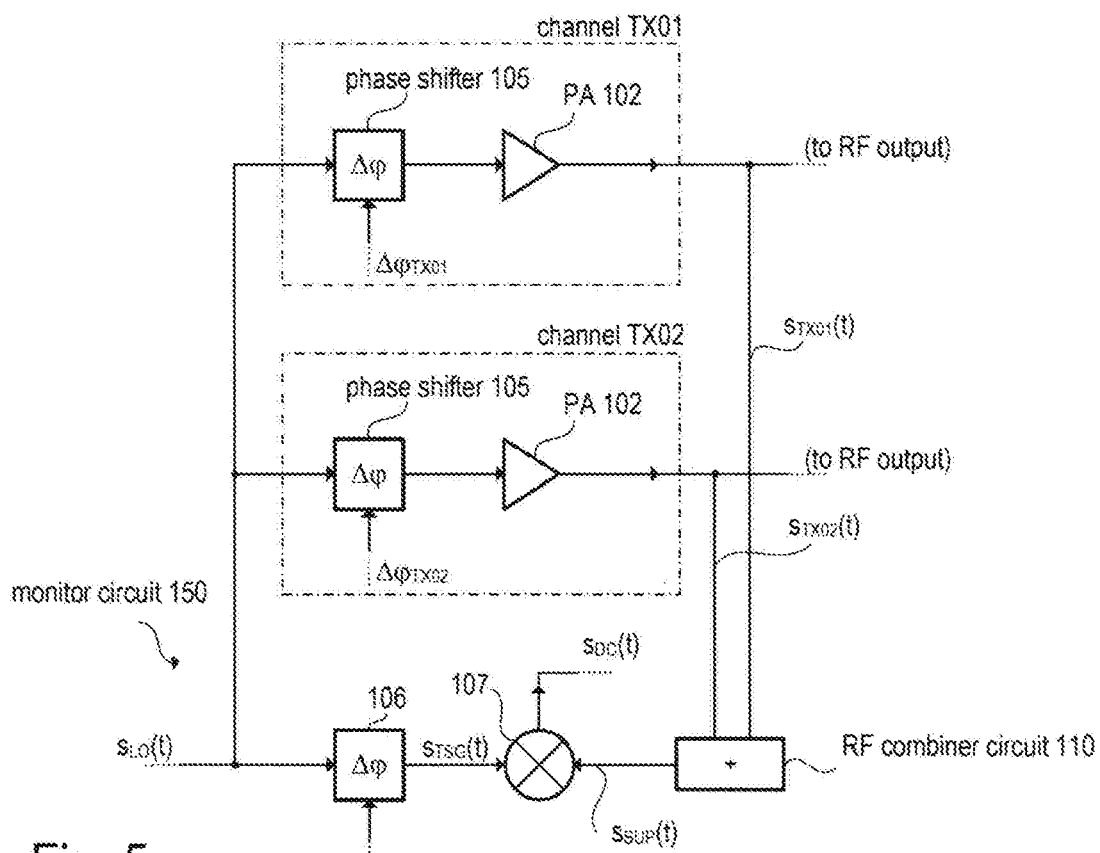
FIG. 5 is a block diagram illustrating one example of a monitor circuit that may be used to sense the phase lags and gains caused by two or more RF channels of an RF circuit.

FIG. 5 is a block diagram illustrating one example of an RF circuit with multiple RF channels for generating multiple RF output signals. In the present example, two transmission channels TX01 and TX02 of a radar sensor are considered as one illustrative application. The concept can be generalized to a system with c channels. However, for a better understanding, one exemplary embodiment with two channels TX01, TX02, will be described first with reference to FIGS. 5 to 8 and equation 1 to 22, whereas FIGS. 9 to 11 and equations 23 to 24 relate to a general embodiment with c channels TX01, TX02, TXc. Furthermore, it is understood that the concept described below may readily be employed in other applications than radar. Furthermore, it is noted that the circuit of FIG. 5 can readily be enhanced to more than two channels (see also FIG. 7). In the present example, each channel TX1 and TX2 is configured to receive, at its input, an RF oscillator signal $s_{LO}(t)$, which may be provided from a local oscillator (see, e.g., FIG. 4, local oscillator 101). Each channel TX1 and TX2 may include a phase shifter 105 for manipulating the overall phase lags caused by channels. The RF output signals of the channels TX01 and TX02 are denoted as $s_{TX01}(t)$ and $s_{TX02}(t)$, respectively. In each channel TX01, TX02 the signal path from the input to the output includes signal lines and one or more circuit components that may cause a phase lag. As a consequence, the output signals can be written as follows:

$$s_{TX01}(t) = A_{TX01} \cdot \cos(2\pi f_{LO} t + \varphi_{TX01} + \Delta \varphi_{TX01}) \quad (1)$$

$$s_{TX02}(t) = A_{TX02} \cdot \cos(2\pi f_{LO} t + \varphi_{TX02} + \Delta \varphi_{TX02}) \quad (2)$$

Thereby, the variables $A_{TX01}$ and $A_{TX02}$ denote the amplitudes of the RF output signals $s_{TX01}(t)$ and $s_{TX02}(t)$, and the frequency $f_{LO}$ is the frequency of the RF oscillator signal $s_{LO}(t)$. The phases $\varphi_{TX01}$ and $\varphi_{TX02}$ represent the phase lag caused by the channels TX01 and TX02, respectively, without considering phase shifters 105, whereas $\Delta\varphi_{TX01}$ and $\Delta\varphi_{TX02}$ denote the additional the phase shifts caused by the phase shifters 105.

At this point it is noted that the phases $\varphi_{TX01}$ and $\varphi_{TX02}$ as well as the amplitudes $A_{TX01}$ and $A_{TX02}$ heavily depend on the operating conditions of the system. For example, depending on which of the channels TX01 and TX02 is active, the temperature of the chip (e.g., the MMIC) will vary due to the power losses caused in the active channel(s). When both channels, TX01 and TX02, are active (i.e., outputting an RF signal) the temperature will be much higher as compared to the case, in which only one channel, TX01 or TX02, is active. Amplitudes and phases of the RF output signals $s_{TX01}(t)$ and $s_{TX02}(t)$ are temperature dependent. For example, in beam forming applications (in which the results of amplitude and phase measurement are applied) both channels TX01 and TX02 are active (transmitting), which causes the temperature to rise to a specific value and thus particular amplitude and phase values. Amplitude and values shifts measured in a configuration, in which only one of the channels (TX01 or TX02) is active, would be different and thus incorrect (as the configuration which only one active channel does not resemble the beamforming application. Accordingly, it may be important to allow measurement of amplitude and phase values while both of the channels are active.

As mentioned, each channel TX01, TX02 includes a phase shifter 105, which are configured to generate additional phase shift values $\Delta\varphi_{TX01}$ and $\Delta\varphi_{TX02}$ (phase lags), which contribute to the phases of the RF output signals $s_{TX01}(t)$ and $s_{TX02}(t)$. Furthermore, each channel TX01, TX02 may include an RF amplifier 102 (e.g., a power amplifier, PA). In this case, the amplitudes $A_{TX01}$ and $A_{TX02}$ of the RF output signals $s_{TX01}(t)$ and $s_{TX02}(t)$ depend on the gains of the RF amplifiers 102. In accordance with one specific example, the phase shifters 105 may be implemented using IQ modulators (In-Phase/Quadrature modulators, also referred to as Quadrature modulators). Digital-to-analog converters (not shown) may be used to convert digital values representing the phase shift values $\Delta\varphi_{TX01}$ and $\Delta\varphi_{TX02}$ into analog signals that can be processed by the IQ modulators.

In some applications (e.g., for the system controller 50 or a radar sensor, see FIG. 3) it may be desirable to know the phases of the RF output signals of the different channels, e.g., relative to each other or relative to a reference phase. For example, the channels TX01 and TX02 may be transmission channels of a radar sensor device and the phases of the RF output signals will be tuned to specific values to achieve a desired radiation angle. As the absolute phase lags caused by the circuit components (e.g., the amplifiers 102) included in the channels TX01 and TX02 may be temperature dependent and may also be subject to production tolerances and aging, the respective phases $\varphi_{TX01}$ and $\varphi_{TX02}$ need to be tuned or monitored, which may be accomplished by the phase shifters 105 included in the channels TX01, TX02. In order to be able to monitor the phases $\varphi_{TX01}$ and $\varphi_{TX02}$ of the RF output signals $s_{TX01}(t)$ and $s_{TX02}(t)$, a monitor circuit 150 (including, e.g., phase shifter 106 and phase mixer 107, see FIG. 5) is provided that is used to sense the phases $\varphi_{TX01}$ and $\varphi_{TX02}$ and thus to detect a possible maladjustment of the phases. In the event that the measured phases $\varphi_{TX01}$ and $\varphi_{TX02}$ deviates from a desired setting, the phase shifters 105 may be used to compensate for the deviation by adding additional phase shifts $\Delta\varphi_{TX01}$ and $\Delta\varphi_{TX02}$.

In the example shown in FIG. 5, the RF output signals $s_{TX01}(t)$ and $s_{TX02}(t)$ are tapped and supplied to an RF combiner circuit 110, which may be configured to combine the RF output signals $s_{TX01}(t)$ and $s_{TX02}(t)$. For example, the combined signal $s_{SUP}(t)$ may be a superposition of the RF output signals such as:

$$s_{SUP}(t) = g_{SUP} \cdot (s_{TX01}(t) + s_{TX02}(t)), \quad (3)$$

wherein $g_{SUP}$ is a defined gain (usually significantly smaller than 1). However, for the present considerations we may assume that $g_{SUP}$ is 1 without loss of generality and thus the combined signal can be written as:

$$s_{SUP}(t) = A_{TX01} \cdot \cos(2\pi f_{LO} t + \varphi_{TX01} + \Delta\varphi_{TX01}) + A_{TX02} \cdot \cos(2\pi f_{LO} t + \varphi_{TX02} + \Delta\varphi_{TX02}). \quad (4)$$

The monitor circuit 150 includes a phase mixer 107 receiving the combined signal $s_{SUP}(t)$ as a TX monitoring signal at its RF port and configured to down-convert the combined signal $s_{SUP}(t)$ using the RF oscillator signal $s_{LO}(t)$. As, in the present embodiment, all RF signals have the same frequency $f_{LO}$, the mixer output signal will be a direct current (DC) value $s_{DC}(t)$ that depends on the phases of $\varphi_{TX01} + \Delta\varphi_{TX01}$ and $\varphi_{TX02} + \Delta\varphi_{TX02}$ of the RF output signals $s_{TX01}(t)$ and $s_{TX02}(t)$. In the present example, the phase mixer 107 receives a phase shifted version of the RF oscillator signal $s_{LO}(t)$; the phase-shifted oscillator signal can thus be expressed as:

$$s_{TSG}(t) = A_{TSG} \cdot \cos(2\pi f_{LO} t + \varphi_{TSG}), \quad (5)$$

wherein $A_{TSG}$ is the known signal amplitude and $\varphi_{TSG}$ the phase of the signal $s_{TSG}(t)$ received at the reference port of the phase mixer 107. The phase $\varphi_{TSG}$ may be set by a phase shifter 106 coupled to the reference port of the phase mixer 107 upstream thereto.

Without loss of generality, amplitude $A_{TSG}$ is assumed to equal 2; a different amplitude will only cause a respective scaling of the measured signal amplitudes. Using equations 4 and 5 and $A_{TSG} = 2$, the mixer output signal $s_{DC}(t)$ provided at the output port of the phase mixer 107 can be expressed as:

$$s_{DC}(t) = s_{LO}(t) \cdot s_{SUP}(t) = (A_{TX01} \cdot \cos(\varphi_{TSG} - \varphi_{TX01} + \Delta\varphi_{TX01}) + A_{TX02} \cdot \cos(\varphi_{TSG} - \varphi_{TX02} - \Delta\varphi_{TX02})) + (A_{TX01} \cdot \cos(4\pi f_{LO} t + \varphi_{TX01} + \Delta\varphi_{TX01}) + A_{TX02} \cdot \cos(4\pi f_{LO} t + \varphi_{TX02} + \Delta\varphi_{TX02})), \quad (6)$$

wherein the summands representing an oscillation at the double frequency $2f_{LO}$ (angular frequency $4\pi f_{LO}$) can be neglected as they are outside of the mixer bandwidth. Accordingly, the mixer output signal $s_{DC}(t)$ can be written as:

$$s_{DC}(t) \approx (A_{TX1} \cdot \cos(\varphi_{TSG} - \varphi_{TX1} - \Delta\varphi_{TX01}) + A_{TX02} \cdot \cos(\varphi_{TSG} - \varphi_{TX02} - \Delta\varphi_{TX02})). \quad (7)$$

Accordingly, the mixer output signal is a DC signal that depends on the cosines of the phase-differences $\varphi_{TSG} - \varphi_{TX1} - \Delta\varphi_{TX01}$ and $\varphi_{TSG} - \varphi_{TX2} - \Delta\varphi_{TX02}$, the amplitudes $A_{TX1}$ and $A_{TX2}$. Without loss of generality, for the subsequently described measurements of the of the mixer output signal $s_{DC}(t)$ the phase shift values $\Delta\varphi_{TX01}$ and $\Delta\varphi_{TX02}$ are assumed to be either 0 or $\pi$ rad, i.e., 0 or 180 degrees. According to the herein described examples, measurements may be made by acquiring discrete samples of the mixer output signal $s_{DC}(t)$ at sampling times $t_{k,0}$, $t_{k,1}$, and $t_{k,2}$. The index k denotes the measurement cycle (k=1, 2, 3, ... ).

The measured DC values (sampled values) of the mixer output signal $s_{DC}(t)$ may be used to calculate the sought phase values $\varphi_{TX01}$ and $\varphi_{TX02}$ and amplitude values $A_{TX01}$ and $A_{TX02}$ as explained below. As mentioned above, the phase $\varphi_{TSG}$ can be set by the phase shifter 106 included in the monitor circuit 150. For a defined value of the phase (D r TSG the following three measurement values can be obtained:

$$s_{DC}(t_{k,0})=(A_{TX01}\cdot\cos(\varphi_{TSG}-\varphi_{TX01}-0)+A_{TX02}\cdot\cos(\varphi_{TSG}-\varphi_{TX02}-0)), \quad (8)$$

$$s_{DC}(t_{k,1})=(A_{TX01}\cdot\cos(\varphi_{TSG}-\varphi_{TX01}-0)+A_{TX02}\cdot\cos(\varphi_{TSG}-\varphi_{TX02}-\pi)), \quad (9)$$

$$s_{DC}(t_{k,2})=(A_{TX01}\cdot\cos(\varphi_{TSG}-\varphi_{TX01}-\pi)+A_{TX02}\cdot\cos(\varphi_{TSG}-\varphi_{TX02}-0)). \quad (10)$$

The first value $s_{DC}(t_{k,0})$ is equal to equation 6 for the measurement time $t=t_{k,0}$. For the measurement of the second value $s_{DC}(t_{k,1})$ an additional phase shift of 180 degree (i.e., $\pi$ rad) is generated in channel TX02. This may be accomplished by temporarily increasing the phase lag caused by phase shifter 105 in the channel TX02 by 180 degrees. For the measurement of the third value $s_{DC}(t_{k,2})$ an additional phase shift of 180 degree (i.e., $\pi$ rad) is generated in channel TX01. This may be accomplished by temporarily increasing the phase lag caused by phase shifter 105 in channel TX01 by 180 degrees (analogously to channel TX02). Accordingly, three samples $s_{DC}(t_{k,0})$, $s_{DC}(t_{k,1})$, and $s_{DC}(t_{k,2})$ are acquired in each measurement cycle in the present example of two channels. As shown later, n+1 samples are acquired in each measurement cycle in the general example with c channels. It is noted, however, that, in the present case with only two channels, the third measurement is redundant and thus optional. However, the third measurement allows a plausibility check for the measured values.

The identity:

$$\cos(\varphi-\pi)\equiv\cos(\varphi+\pi)\equiv-\cos(\varphi) \quad (11)$$

can be used to simplify equations 9 and 10. Accordingly, the second and the third value (see equations 9 and 10) can be expressed as:

$$s_{DC}(t_{k,1})=(A_{TX01}\cdot\cos(\varphi_{TSG}-\varphi_{TX01})-A_{TX02}\cdot\cos(\varphi_{TSG}-\varphi_{TX02})), \text{ and} \quad (12)$$

$$s_{DC}(t_{k,2})=(-A_{TX01}\cdot\cos(\varphi_{TSG}-\varphi_{TX01})+A_{TX02}\cdot\cos(\varphi_{TSG}-\varphi_{TX02})), \quad (13)$$

respectively. Adding equations 8 and 12 and equations 8 and 13 yields the measured values:

$$M_{01}[k]=(s_{DC}(t_{k,0})+s_{DC}(t_{k,1}))=2A_{TX01}\cdot\cos(\varphi_{TSG}-\varphi_{TX01}), \text{ and} \quad (14)$$

$$M_{02}[k]=(s_{DC}(t_{k,0})+s_{DC}(t_{k,2}))=2A_{TX02}\cdot\cos(\varphi_{TSG}-\varphi_{TX01}). \quad (15)$$

As mentioned above, the acquisition of the third sample $s_{DC,2}(t_k)$ (equation 15) is redundant in the present embodiment as subtracting equation 12 from equation 8 yields the same result as equation 15:

$$M_{02}[k]=(s_{DC}(t_{k,0})-s_{DC}(t_{k,1}))=2A_{TX02}\cdot\cos(\varphi_{TSG}-\varphi_{TX01}). \quad (16)$$

The value $M_{01}[k]$ only depends on the phase difference $\varphi_{TSG}-\varphi_{TX01}$ and the amplitude $A_{TX01}$ of the RF output signal $s_{TX01}(t)$ of channel TX01. Similarly, the value $M_{02}[k]$ only depends on the phase difference $\varphi_{TSG}-\varphi_{TX02}$ and the amplitude $A_{TX02}$ of the RF output channel $s_{TX02}(t)$ of channel TX02. It is noted that the term "measured value" or "sampled value" is used for the values $M_{01}[k]$ and $M_{02}[k]$, which are, in fact, not directly measured but calculated based on the sampled mixer output values $s_{DC}(t_{k,0})$, $s_{DC}(t_{k,1})$ and $s_{DC}(t_{k,2})$. Nevertheless, those values $M_{01}[k]$ and $M_{02}[k]$ are regarded as an (intermediate) result of the measurement described herein and thus referred to as "measured values" which represent samples of the RF output signals $s_{TX01}(t)$, $s_{TX01}(t)$ of the RF channels TX01, TX02. As will be shown later c values $M_{01}[k]$, $M_{02}[k]$, ..., $M_c[k]$ can be calculated in an example with c channels TX01, TX02, ..., TXc.

If the amplitudes $A_{TX01}$ and $A_{TX02}$ are measured separately (e.g., by using power sensors coupled to the outputs of channels TX01 and TX02), the sought phases $\varphi_{TX01}$ and $\varphi_{TX02}$ can be directly calculated from the measured values $M_{01}[k]$ and $M_{02}[k]$ obtained in one measurement cycle. However, the measurements may be repeated for different values $\varphi_{TSG}$; the phase value provided by phase shifter 106 in the k-th measurement cycle is denoted as $\varphi_{TSG}[k]$. Thus, the measured values of equations 14 and 15 become:

$$M_{01}[k]=2A_{TX01}\cdot\cos(\varphi_{TSG}[k]-\varphi_{TX01}), \text{ and} \quad (17)$$

$$M_{02}[k]=2A_{TX02}\cdot\cos(\varphi_{TSG}[k]-\varphi_{TX02}). \quad (18)$$

Theoretically, four measured values, for example $M_{01}[k]$, $M_{02}[k]$, $M_{01}[k+1]$ and $M_{02}[k+1]$ obtained in the measurement cycles k and k+1, would be sufficient to calculate the sought phases $\varphi_{TX01}$ and $\varphi_{TX02}$ and amplitudes $A_{TX01}$ and $A_{TX02}$, provided that $\varphi_{TSG}[k+1]\neq\varphi_{TSG}[k]$. In practice, a plurality of measured values can be obtained in a plurality of measurement cycles for different phase values $\varphi_{TSG}[k]$ and used to estimate the sought phases $\varphi_{TX01}$ and $\varphi_{TX02}$ and amplitudes $A_{TX01}$ and $A_{TX02}$ with improved precision.

Figure 6:
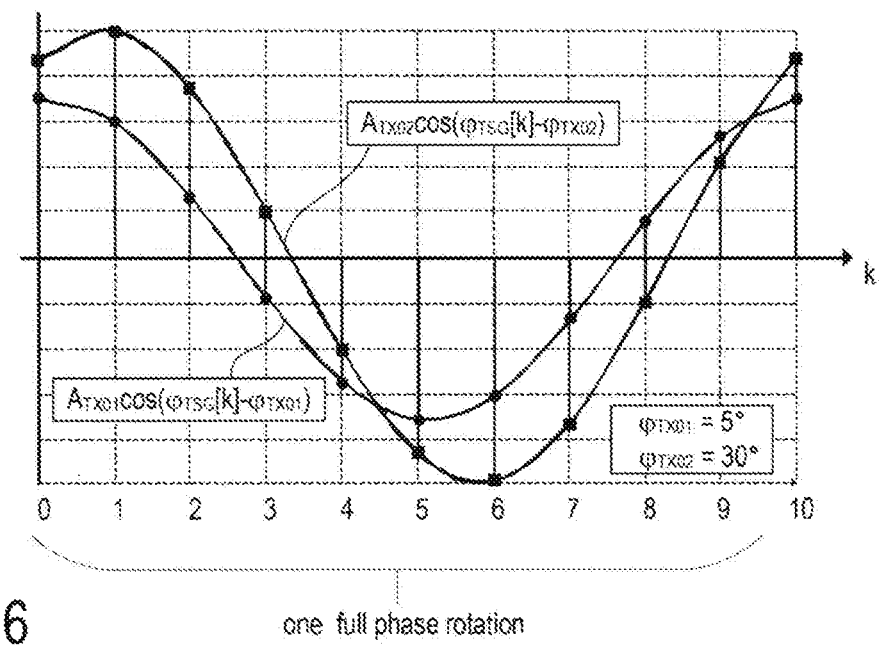
FIG. 6 is a diagram illustrating one example of a measurement sequence for measuring phases and signal amplitudes of the RF output signals of a multi-channel RF circuit using a circuit in accordance with the embodiments described herein.

The diagram of FIG. 6 illustrates the measured values $M_{01}[k]$ and $M_{02}[k]$ for a sequence of measurement cycles, wherein $\varphi_{TSG}[k]=k\pi/5$ and $k=0, 1, \ldots 10$. That is, the phase $\varphi_{TSG}$ provided by the phase shifter 106 is increased from zero degrees in steps of 36 degrees up to 360 degrees. The measured values $M_{01}[0], M_{01}[1], \ldots, M_{01}[10]$ can be used to estimate amplitude $A_{TX01}$ and phase $\varphi_{TX01}$ using equation 17 as signal model and any suitable estimation technique such as a non-linear least mean squares (LMS) method. Similarly, the measured values $M_{02}[0], M_{02}[1], M_{02}[10]$ can be used to estimate amplitude $A_{TX02}$ and phase $\varphi_{TX02}$ using equation 18 as signal model. In one specific example, a Fourier transform algorithm such the Fast Fourier Transform (FFT) is used for the estimation of amplitudes and phases. In this case, the phase $\varphi_{TSG}[k]$ may be increased in each measurement cycle using a constant step size; alternatively, the measured sequences may be resampled to obtain equidistant sampling points.

Figure 7:
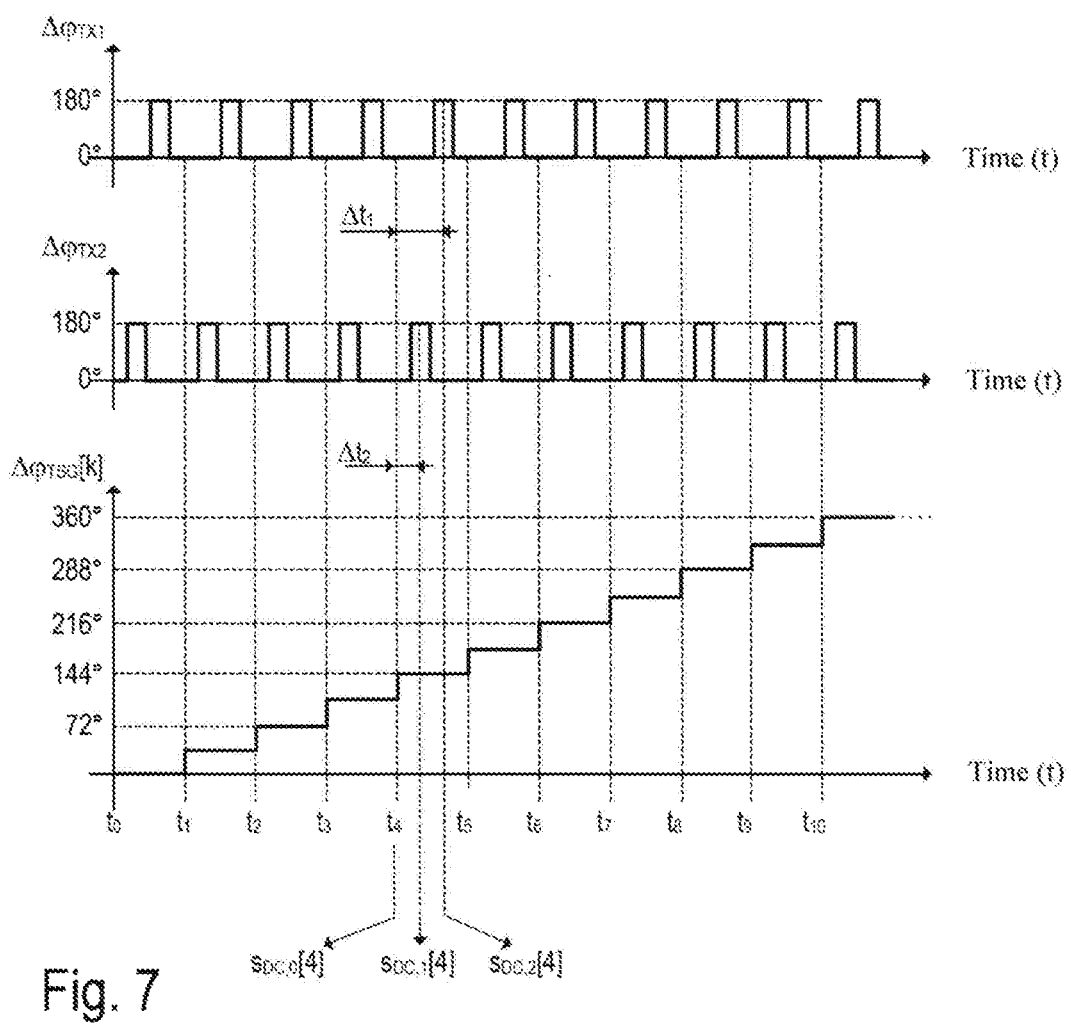
FIG. 7 includes timing diagrams illustrating the purpose and function of the circuit of FIG. 5 in more detail.

The measurement sequence shown in FIG. 6 is further illustrated by the timing diagrams of FIG. 7. FIG. 7 includes timing diagrams illustrating the phase shift values $\varphi_{TSG}[k]$, $\Delta\varphi_{TX01}$, and $\Delta\varphi_{TX02}$ generated by the phase shifter 106 of the monitor circuit 105 the phase shifter 105 of the first channel TX01, and the phase shifter 105 of the second channel TX02, respectively. The start time of the measurement cycles is denoted as $t_k$, and the corresponding phase value generated by phase shifter 106 as $\varphi_{TSG}[k]$, wherein k=0, 1, 2, 3, etc. As shown in previous FIG. 6, the phase $\varphi_{TSG}[k]$ is increased in each measurement cycle. In the present example, the step size is 705 rad (i.e., 36 degrees), and thus $\varphi_{TSG}[k]=k\pi/5$.

Three samples of the mixer output signal $s_{DC}(t)$ are sampled in each measurement cycle, that is $s_{DC,0}[k]$, $s_{DC,1}[k]$, and $s_{DC,2}[k]$, wherein (cf. equations 8-10):

$$s_{DC,0}[k] = s_{DC}(t_k) = s_{DC}(t_{k,0}), \quad (19)$$

$$s_{DC,1}[k] = s_{DC}(t_k + \Delta t_1) = s_{DC}(t_{k,1}), \quad (20)$$

$$s_{DC,2}[k] = s_{DC}(t_k + \Delta t_2) = s_{DC}(t_{k,2}). \quad (21)$$

In FIG. 4 the sampling times are shown for the measurement cycle k=4. The phase shifts $\Delta\varphi_{TX01}$ and $\Delta\varphi_{TX02}$ generated by the phases shifters 105 in channels TX01 and TX02 alternate between 0 and $\pi$ rad (i.e., 180 degrees) in such a manner that—at the sampling time $t_k + \Delta t_2$—the phase lag caused by channel TX02 is inverted (i.e., $\varphi_{TX02} \rightarrow \varphi_{TX02} \pm \pi$), while the phase lag caused by channel TX01 is left unchanged and that at the sampling time $t_k + \Delta t_t$—the phase lag caused by channel TX01 is inverted (i.e., $\varphi_{TX01} \rightarrow \varphi_{TX01} \pm \pi$), while the phase lag caused by channel TX02 is left unchanged. The three samples obtained in each measurement cycles can be used to calculate the measured values $M_{01}[k]$ and $M_{02}[k]$, for example, in accordance with equations 14 and 15. Subsequently, the measured values $M_{01}[k]$ and $M_{02}[k]$ (for k=1, 2, 3, etc.) can be used to estimate the sought amplitude values $A_{TX01}$ and $A_{TX02}$ and phase values $\varphi_{TX01}$ and $\varphi_{TX02}$.

It is noted that the time spans $\Delta t_1$ and $\Delta t_t$ are not necessarily constant throughout the measurement cycles k. Further, the time instants $t_k$ are not necessarily equidistant in time as there is no need for a synchronous sampling in accordance with a clock signal. In each measurement cycle, the value $s_{DC,0}[k]$ may be sampled once the phase value $\varphi_{TSG}[k]$ has been updated, the value $s_{DC,1}[k]$ may be sampled once the phase $\varphi_{TX02}$ has been inverted, and the value $s_{DC,2}[k]$ may be sampled once the phase $\varphi_{TX01}$ has been inverted and the inversion of phase $\varphi_{TX02}$ has been undone. Subsequently, the phase value $\varphi_{TSG}[k]$ is updated and the next cycle starts ($k \rightarrow k+1$).

Figure 8:
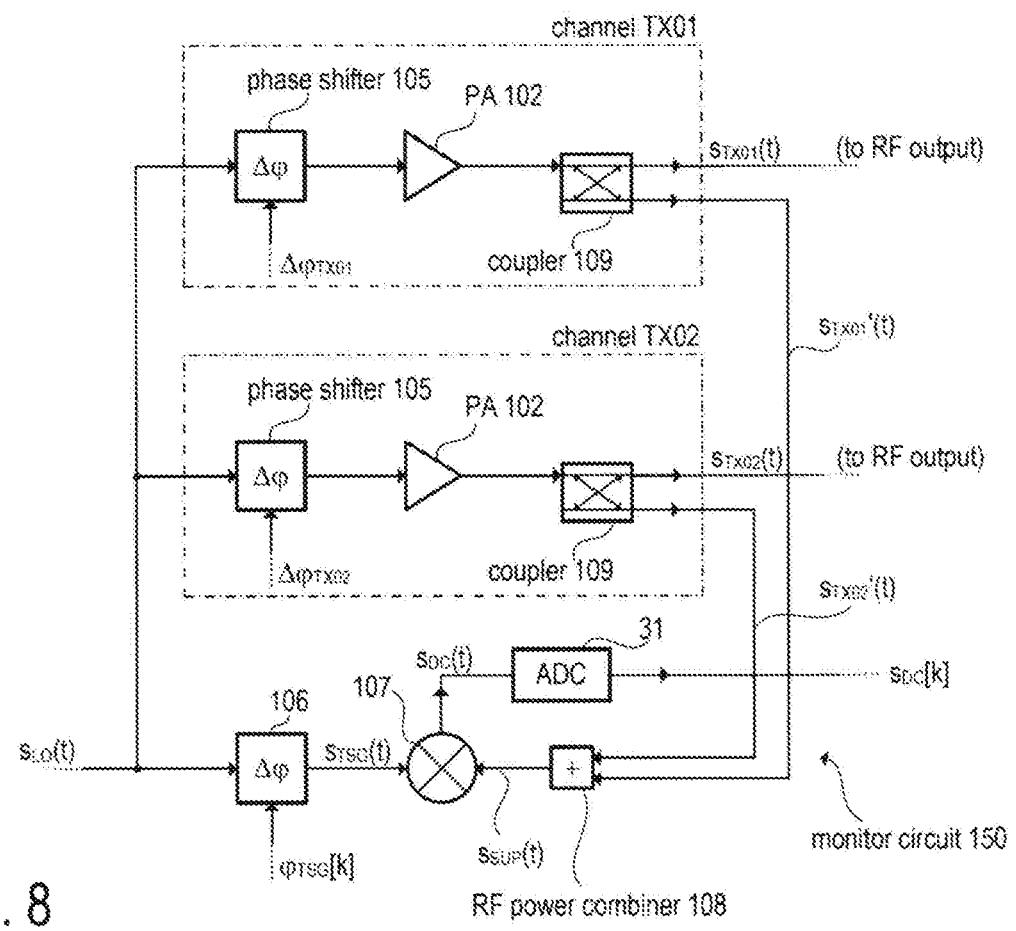
FIG. 8 is a block diagram illustrating one exemplary implementation of the example of FIG. 5.

FIG. 8 illustrates one exemplary implementation of the previous example of FIG. 5 in more detail. The example of FIG. 8 is substantially the same as the previous example of FIG. 5; however, the implementation of the RF combiner circuit 110 is shown in more detail as well as a sensor analog-to-digital converter (ADC) 31 used to digitize the mixer output signal $s_{DC}(t)$. In accordance with the present example, the combiner circuit 110 as shown in previous FIG. 5 is implemented using a power combiner 108 (e.g., a Wilkinson power combiner that provides a linear combination of the signals) and directional couplers 109 (e.g., rat-race couplers, circulators, or the like), wherein one coupler is arranged in each channel TX01 and TX02, and configured to direct a fraction of the power of the respective output signal $s_{TX01}(t)$ and $s_{TX02}(t)$ to the inputs of the power combiner 108. The signals branched-off at the outputs of the channels TX01 and TX02 by the couplers 109 are denoted as $s_{TX01}'(t)$ and $s_{TX02}'(t)$, wherein $s_{TX01}'(t) = g_C s_{TX01}(t)$ and $s_{TX02}'(t) = g_C s_{TX02}(t)$ and $g_C$ is the transmission coefficient of the coupler with regards to the branched-off signal. Usually $g_C$ is significantly lower than 1, while the transmission coefficient with regards to the antenna signal is approximately 1. The power combiner 108 essentially provides the (e.g., scaled) sum of the input signals, that is:

$$s_{SUP}(t) = g_{COMB} \cdot (s_{TX01}'(t) + s_{TX02}'(t)) = g_{SUP} \cdot (s_{TX01}(t) + s_{TX02}(t)), \quad (22)$$

wherein the gain $g_{SUP}$ equals $g_{COMB} \cdot g_C$. Accordingly, the combined signal $s_{SUP}(t)$ is substantially a scaled version of the sum of the channel output signals $s_{TX01}(t)$ and $s_{TX02}(t)$ (see also equation 3). However, as mentioned above, the gain $g_{SUP}$ may be assumed to be 1 for the present discussion without loss of generality. Apart from the RF combiner circuit 110, which is implemented by the couplers 109 and the RF power combiner 108, the example of FIG. 8 is the same as the example of FIG. 5 and reference is made to the explanations above.

Figure 9:
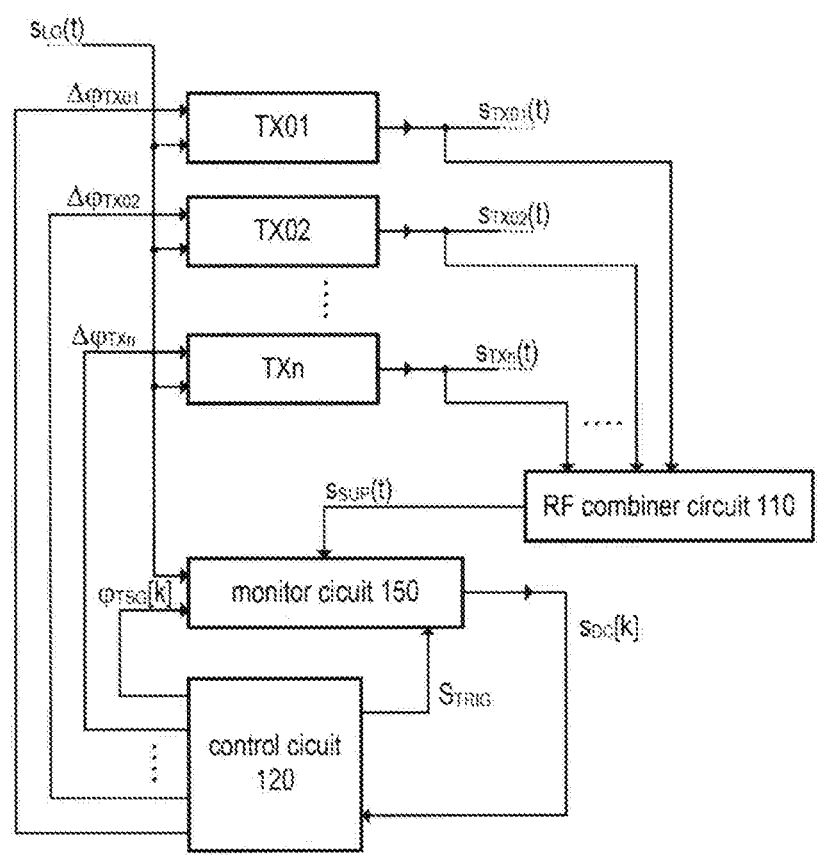
FIG. 9 is a block diagram illustrating a general example of an RF circuit with multiple RF channels providing multiple RF output signals, a monitor circuit that may be used to sense phases and amplitudes of the RF output signals, and a control circuit for controlling measurement sequences that may be performed by the monitor circuit.

As already indicated above, the concept described above with regards to two channels TX01 and TX02 may be readily extended to c channels TX01, TX02, . . . , TXc, wherein c>2. In this case the RF combiner circuit 110 (see FIG. 5) or the RF power combiner 108 (see FIG. 8) has c inputs. Alternatively, several power combiners may be cascaded to combine the desired number of RF signals. Irrespective of the implementation of the RF combiner circuit 110 the combined signal $s_{SUP}(t)$ can be regarded as a (scaled) superposition of the RF output signals $s_{TX01}(t)$, $s_{TX02}(t)$, . . . , $s_{TXc}(t)$. This situation is illustrated in the example of FIG. 9. Examples of phase switching schemes, which may be used in each measurement cycle, are explained with reference to FIGS. 10 and 11.

According to the example of FIG. 9, an RF circuit includes a plurality of channels TX01, TX02, . . . , TXc configured to receive the RF oscillator signal $s_{LO}(t)$ and the respective phase shift values $\Delta\varphi_{TX01}, \Delta\varphi_{TX02}, \ldots, \Delta\varphi_{TXc}$ for the phases shifters 105 (see FIG. 5), and to provide the respective RF output signals $s_{TX01}(t), s_{TX02}(t), \ldots, s_{TXc}(t)$. Each of the RF output signals is characterized by an amplitude $A_{TX01}, A_{TX02}, \ldots, A_{TXc}$, and a phase $\varphi_{TX01}, \varphi_{TX02}, \ldots, \varphi_{TXc}$, which are to be estimated using the concept described herein, that is:

$$s_{TX01}(t) = A_{TX01} \cdot \cos(2\pi f_{LO} t + \varphi_{TX01} + \Delta\varphi_{TX01}) \quad (23)$$

$$\vdots$$

$$s_{TXc}(t) = A_{TXc} \cdot \cos(2\pi f_{LO} t + \varphi_{TXc} + \Delta\varphi_{TXc}).$$

The above-mentioned combined signal $s_{SUP}(t)$ is supplied to the monitor circuit 150 which is configured to down-convert the combined signal $s_{SUP}(t)$ as explained above with reference to FIGS. 5 and 8. The mixer output signal $s_{DC}(t)$ may be digitized and provided as digital signal. As also explained with reference to FIG. 5, the monitor circuit receives a phase value $\varphi_{TSG}[k]$ which determines the phases of the RF local oscillator signal $s_{TSG}(t)$ used for the down-conversion (see equation 5).

The RF circuit of FIG. 9 may include a control circuit 120 which may include, for example, a programmable processor such as a (e.g., embedded) microcontroller or a similar device. The functions provided by the control circuit 120 may be (e.g., fully or partly) provided by the system controller 50 (see FIG. 3). Additionally or alternatively, the functions provided by the control circuit 120 may be at least partly be provided by the DSP 40 (see FIG. 3). As such the control circuit 120 in FIG. 9 represents a portion of the functions of the system controller 50 and/or the DSP 40. In an alternative embodiment, the control circuit 120 may be implemented in the same MMIC as the monitor circuit 150 and the channels TX01, TX02, etc., but separate from the system controller 50.

As mentioned above, three samples $s_{DC,0}[k]$, $s_{DC,1}[k]$ and $s_{DC,2}[k]$ are acquired in each measurement cycle k in case of two channels and c+1 samples in case of c channels $s_{DC,0}[k]$, $s_{DC,1}[k], \ldots, s_{DC,c}[k]$. Theoretically a single measurement cycle is sufficient to determine the phase values $\varphi_{TX01}$, $\varphi_{TX02}, \ldots, \varphi_{TXc}$ associated with the c channels TX01, TX02, ..., TXc, and at least two measurement cycles are needed to determine the phase values $\varphi_{TX01}, \varphi_{TX02}, \ldots, \varphi_{TXc}$ and the respective amplitude values $A_{TX01}, A_{TX02}, \ldots, A_{TXc}$. In practice, however, a plurality of measurement cycles are performed in order to improve the quality of phase and amplitude estimation. In one illustrative exemplary embodiment, 64 measurement cycles are performed which allows the use of a 64 point Fast Fourier Transform (FFT) algorithm to estimate phase and amplitude values of each channel.

The control circuit 120 may be configured to provide the phase shift values $\Delta\varphi_{TX01}, \Delta\varphi_{TX02}, \ldots, \Delta\varphi_{TXc}$ for the phases shifters 105 of the channels TX01, TX02, ..., TXc as well as the phase value $\varphi_{TSG}[k]$ for the phases shifter 106 of the monitor circuit 150. Furthermore, the control circuit may generate a trigger signal $S_{TRIG}$ used to trigger the sensor ADC 31 included in the monitor circuit 150 at the desired sampling times (e.g., times $t_{k,0}=t_k$, $t_{k,1}=t_k+\Delta t_1$, $t_{k,2}=t_k+\Delta t_2$, etc.). In particular, the control circuit 120 may be configured to control the data acquisition during a plurality of measurement cycles in accordance with a scheme shown, e.g., in FIGS. 6 and 7. Accordingly, the phase value $\varphi_{TSG}[k]$ is updated in each measurement cycle k, and c+1 measurements are made in each cycle. According to one embodiment, the following c+1 values may be sampled in each measurement cycle: $s_{DC,0}[k], s_{DC,1}[k], \ldots s_{DC,c}[k]$ (see also FIG. 10A). Thereby, all phase shift values $\Delta\varphi_{TX01}, \Delta\varphi_{TX02}, \ldots, \Delta\varphi_{TXc}$ are set in accordance with a defined phase configuration (referred to as reference configuration, e.g., all phase shifts may be set to zero) when sampling $S_{DC,0}[k]$; then all phase shift values $\Delta\varphi_{TX01}, \Delta\varphi_{TX021}, \ldots, \Delta\varphi_{TXn}$ except the i-th phase shift value $\Delta\varphi_{TXi}$ is inverted (i.e., increased or decreased by 180°) when sampling $s_{DC,i}[k]$ (for i=1, 2, ..., c) as illustrated in the scheme shown in FIG. 10A. Analogously to equations 14 and 15, the measured values may be determined as follows in each measurement cycle k (see also FIG. 10B):

$$M_{01}[k] = (s_{DC,0}[k] + s_{DC,1}[k]) = A_{TX01} \cdot \cos(\varphi_{TSG}[k] - \varphi_{TX01}),$$

$$M_{02}[k] = (s_{DC,0}[k] + s_{DC,2}[k]) = A_{TX02} \cdot \cos(\varphi_{TSG}[k] - \varphi_{TX02}),$$

$$\vdots$$

$$M_c[k] = (s_{DC,0}[k] + s_{DC,c}[k]) = A_{TXc} \cdot \cos(\varphi_{TSG}[k] - \varphi_{TXc}).$$

(24)

By stepwise increasing the phases $\varphi_{TSG}[k]$—in each measurement cycle—k samples of the RF output signals $s_{TX01}(t), s_{TX02}(t), \ldots, s_{TXc}(t)$ can be determined as illustrated in the diagram of FIG. 6 and known estimation algorithms may be used to estimate the amplitudes $A_{TX01}, A_{TX02}, \ldots, A_{TXc}$ and phases $\varphi_{TX01}, \varphi_{TX02}, \ldots, \varphi_{TXc}$ as discussed above with reference to FIGS. 5 to 7.

It is noted that varying the phases value $\varphi_{TSG}[k]$ is equivalent to simultaneously varying all phase shift values $\Delta\varphi_{TX01}, \Delta\varphi_{TX02}, \ldots, \Delta\varphi_{TXc}$ of the phase shifters 105 (where applicable in addition to the phase inversion). This is evident, for example, from equation 24; one can see that, e.g., $\varphi_{TSG}[k]=10°$ yields the same result as $\varphi_{TSG}[k]=0°$, if instead the phase shift values $\Delta\varphi_{TX01}, \Delta\varphi_{TX02}, \ldots, \Delta\varphi_{TXc}$ are all decreased by 10° (i.e., increased by 350°). That is:

$$A_{TXi} \cdot \cos(\varphi_{TSG}[k] - \varphi_{TXi}) = A_{TXi} \cdot \cos(0 - (\varphi_{TXi} + \Delta\varphi_{TXi})),$$ (25)

if $\Delta\varphi_{TXi} = -\varphi_{TSG}[k]$ for all i=1, 2, ..., n. In other words, the function of the phase shifter 106 may be provided in common by the phase shifters 105, and changing the phase value $\varphi_{TSG}[k]$ can have the same effect as changing the reference configuration, according to which the phase shift values $\Delta\varphi_{TX01}, \Delta\varphi_{TX02}, \ldots, \Delta\varphi_{TXc}$ of phase shifters 105 are set. It is further noted that, although incrementing/decrementing the phase value $\varphi_{TSG}[k]$ is theoretically equivalent to simultaneously incrementing/decrementing all phase shift values $\Delta\varphi_{TX01}, \Delta\varphi_{TX02}, \ldots, \Delta\varphi_{TXc}$ of the phase shifters 105, the first option may yield better results as the second option is more susceptible to potential mismatches between the phase shifters 105.

The method described above for measuring the amplitudes $A_{TXi}$ and the phases $\varphi_{TXi}$ of the RF output signals $s_{TXi}(t)$ of RF channels $TX_i$ is further summarized below with reference to the equation schemes in FIGS. 10A-10B, 11A-11B and the flow chart of FIG. 12. In case of cRF channels the index i runs from 1 to it. The equation schemes in FIGS. 10A-10B is a generalization of equations 8 to 10 and illustrates how the configuration, according to which the phase shift values $\Delta\varphi_{TXi}$ (supplied to phase shifters 105 in RF channels $TX_i$) are set, is changed during a measurement cycle k by inversion of one or more of the phase shift values $\Delta\varphi_{TXi}$. As mentioned above, the reference configuration (i.e., the initial setting of the phase shift values $\Delta\varphi_{TXi}$) and the phase $\varphi_{TSG}[k]$ of the RF reference signal $s_{TSG}(t)$ are constant during one measurement cycle (see FIG. 12, step S1).

Figure 12:
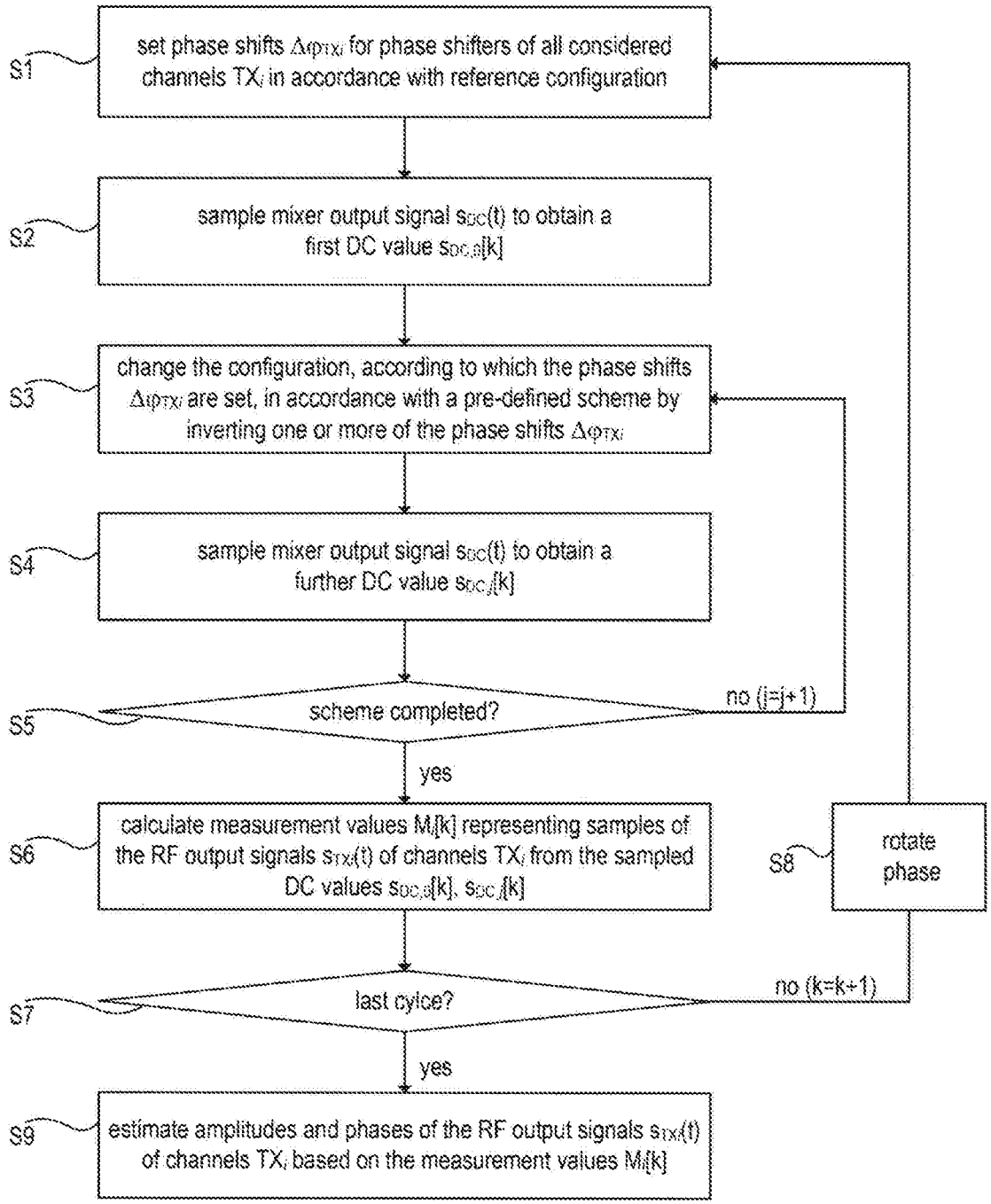
FIG. 12 is a flow chart illustrating one exemplary method for measuring amplitudes and phases of the RF output signals of different RF channels.

According to the scheme of FIG. 11A, the first DC value $s_{DC,0}[k]=s_{DC}(t_{k,0})$ of the mixer output signal $s_{DC}(t)$ is sampled at a reference configuration of the phase shift values $\Delta\varphi_{TXi}$ (see FIG. 12, step S2). As mentioned, without loss of generality, the reference configuration may be chosen such that all phase shift values $\Delta\varphi_{TXi}$ are zero. However, any other configuration may be used. Then, the configuration, according to which the phase shift values $\Delta\varphi_{TXi}$ are set, is modified in accordance with a pre-defined scheme by inversion of one or more of the phase shift values $\Delta\varphi_{TXi}$ (see FIG. 12, step S3), and a further DC value $s_{DC,1}[k]$ of the mixer output signal $s_{DC}(t)$ is sampled at the modified configuration (see FIG. 12, step S4). Inversion of a phase shift value may be accomplished by adding or subtracting $\pi$ rad (180 degrees). As shown in FIG. 10A, all phase shift values $\Delta\varphi_{TXi}$ except $\Delta\varphi_{TX1}$ are inverted (increased/decreased by $\pi$) while sampling the DC value $s_{DC,1}[k]$, all phase shift values $\Delta\varphi_{TXi}$ except $\Delta\varphi_{TX2}$ are inverted while sampling the DC value $s_{DC,2}[k]$, and generally all phase shift values $\Delta\varphi_{TXi}$ except $\Delta\varphi_{TXj}$ are inverted while sampling the j-th further DC value $s_{DC,j}[k]$ (for j=1, ..., c). The modification of the configuration and the sampling of DC values $s_{DC,j}[k]$ are repeated until the pre-defined scheme has been completely processed (see FIG. 12, step S5).

The sampled DC value $s_{DC,0}[k]$ and the further DC values $s_{DC,1}[k], \ldots, s_{DC,c}[k]$ are then used to calculate measurement values $M_i[k]$ representing samples of the RF output signals $s_{TXi}(t)$ of channels $TX_i$ (see FIG. 12, step S6, i= 1, 2, ..., c). These calculations are illustrated in FIG. 10B, which are a generalization of equations 17 and 18. Accordingly, for calculating the $i^{th}$ value $M_i[k]$ the sampled DC value $s_{DC,1}[k]$ is added to the first value $s_{DC,0}[k]$ (which is obtained for the reference configurations of the phase shift values $\Delta\varphi_{TXi}$). If the measurement is continued with the next cycle (see FIG. 12, step S7), the phase is rotated (see FIG. 12, step S8), which may be done by modifying the phase $\varphi_{TSG}[k]$ of the RF reference signal $s_{TSG}(t)$ (as illustrated in FIG. 7, third diagram), which is—as explained above— equivalent to changing the reference configuration, according to which the phase shift values $\Delta\varphi_{TXi}$ (supplied to phase shifters 105 in RF channels $TX_i$) are set, by equally modifying all phase shift values $\Delta\varphi_{TXi}$ (i=1, ..., c) before any phase inversion is applied. The equivalence of these two options has been explained above with reference to equation 25.

If the measurement is completed after a defined number of cycles k, the measurement values $M_i[k]$ are used to estimate amplitudes $A_{TXi}$ and phases $\varphi_{TXi}$ of the RF output signals $s_{TXi}(t)$ of RF channels $TX_i$ (see FIG. 12, step S9). For example, after K measurement cycles have been run through, and if K is a power of two (k=0, . . . , K−1), amplitude $A_{TX01}$ and phase $\varphi_{TX01}$ can be estimated from the measured values $M_{01}[k]$ using an FFT algorithm, amplitude $A_{TX02}$ and phase $\varphi_{TX02}$ can be estimated from the measured values $M_{02}[k]$, etc.

According to the scheme shown in FIGS. 10A and 10B, all phase shift values $\Delta\varphi_{TX01}$, . . . , $\Delta\varphi_{TXc}$, except the j-th phase shift value $\Delta\varphi_{TXj}$, are inverted while sampling the j-th DC mixer output value $s_{DC,j}[k]$. As a result, the sampled DC values $s_{DC,j}[k]$ are added to $s_{DC,0}[k]$ to obtain the corresponding measured value $M_j[k]$. FIGS. 11A and 11B illustrate an alternative scheme, which is equivalent. In accordance with FIG. 11A, the phase shift values $\Delta\varphi_{TX01}$, . . . , $\Delta\varphi_{TXc}$ are unchanged (as compared to the reference configuration) and are not inverted, except the j-th phase shift value $\Delta\varphi_{TXj}$, which is the only phase shift value that is inverted while sampling the j-th DC mixer output value $s_{DC,j}[k]$. As a result, as shown in FIG. 11B, the sampled DC values $s_{DC,j}[k]$ are subtracted from $s_{DC,0}[k]$ to obtain the corresponding measured value $M_j[k]$. The equivalence of the two schemes has already been mentioned in connection with equation 16. As a consequence of this equivalence, the two approaches of FIGS. 10A, 10B, 11A, and 11B can be mixed, resulting in further schemes which are also equivalent. In the case of only two channels TX01 and TX02 the two approaches are theoretically identical (when neglecting tolerances and measurement errors), which makes one measurement redundant (cf. equations 15 and 16).

The described embodiments implement a concept that allows the monitoring of phase and/or signal amplitude of the output signals of multiple RF channels; and the monitoring allows an assessment whether the phases and/or amplitudes are balanced. In this context "balanced phases" means that the phases of the RF channel output signals are equal or differ by predefined values. Phase balancing may be important when using phased array antennas or beam forming techniques. Similarly, amplitude balancing, usually means that the amplitudes of the RF channel output signals are equal or correspond to defined values. If the RF channels are out of balance, the control circuit (or any other circuitry coupled thereto) may initiate counter measures to bring the RF channels into balance. It is noted that the concepts described above may be implemented on-chip, i.e., the monitor circuit as well as supplementary circuitry may be implemented on the same chip as the RF channels (e.g., the MMIC).

As mentioned above, an FFT algorithm may be used to determine the sought amplitudes and phases from the measured values $M_{01}[k]$, $M_{02}[k]$, . . . , $M_c[k]$. Alternatively, a specific implementation of a discrete Fourier Transform (DFT) may be used as discussed below. As shown for example in FIGS. 6 and 7, the phase rotation may be done by modifying the phase $\varphi_{TSG}[k]$ of the RF reference signal $s_{TSG}(t)$ by constant increments (see FIGS. 6 and 7). In case the phase rotation covers an integer multiple of $2\pi$ (e.g., 360°), the sought amplitude and phase information is included in a single frequency bin of the discrete spectrum.

For example, in case the phase $\varphi_{TSG}[k]$ is rotated in steps of 90° in four measurement cycles (i.e., $\varphi_{TSG}[0]=0$, $\varphi_{TSG}[1]=\pi/2$, $\varphi_{TSG}[2]=\pi$, and $\varphi_{TSG}[3]=3\pi/2$), then the measurement values $M_{01}[0]$, . . . , $M_{01}[3]$ (for the first channel TX01) are distributed exactly over one period $[0, 2\pi]$, and all frequency bins (discrete frequency values) of the discrete spectrum of the measurement values $M_{01}[k]$ will be substantially zero except the first bin with index n=1. If no noise is present the other frequency bins will be exactly zero. Similarly, in case the phase $\varphi_{TSG}[k]$ is rotated in steps of 90° in eight measurement cycles (i.e., $\varphi_{TSG}[0]=0$, $\varphi_{TSG}[1]=\pi/2$, $\varphi_{TSG}[2]=\pi$, and $\varphi_{TSG}[3]=3\pi/2$, $\varphi_{TSG}[4]=\pi$, $\varphi_{TSG}[5]=5\pi/2$, $\varphi_{TSG}[6]=3\pi$, $\varphi_{TSG}[7]=7\pi/2$), then the measurement values $M_{01}[0]$, . . . , $M_{01}[7]$ cover exactly two periods $[0, 4\pi]$, and all frequency bins (discrete frequency values) of the discrete spectrum of measurement values $M_{01}[k]$ will be substantially zero except the second bin with index n=2. Accordingly, it is sufficient to process only the non-zero frequency bins for obtaining the sought information about the phase, amplitude (and thus signal power). This results in reduced power consumption and faster estimation of the above parameters since only one spectral value has to be calculated instead of the whole discrete spectrum. It is noted that a spectral value may indicate an amplitude and phase for a specific frequency component of the sequence including the sampled values. For example, for the sampled values shown in FIGS. 14 and 15, the spectral value corresponds to the phase and the amplitude of the sinusoidal waveform shown in the respective diagrams.

To further analyze the concept described herein, the discrete Fourier transform of the sequence $M_c[k]$ (measured values for the c-th channel) is considered:

$$Y[n] = \Sigma_{k=0}^{N-1} M_c[k] \cdot W_N^{k \cdot n} \qquad (26)$$

wherein the complex weight factor $W_N$ is defined as (j being the imaginary unit)

$$W_N = e^{-j \cdot 2\pi/N}. \qquad (27)$$

If the phase rotation of the phase $\varphi_{TSG}[k]$ covers one full rotation (i.e., the interval $[0, 2\pi]$) in N steps of $2\pi/N$, then the sought information is in the first frequency bin, i.e., in $Y[1]$. At this point it is noted that the zeroth frequency bin $Y[0]$ includes the DC-Offset of the sequence $M_c[k]$ which is substantially zero. As indicate above, if the phase rotation of the phase $\varphi_{TSG}[k]$ is distributed over two full rotation (i.e., the interval $[0, 4\pi]$) in N steps of $4\pi/N$, then the sought information is in the second frequency bin, i.e., $Y[2]$. If the phase rotation covers three full rotations, then the sought information is in the third frequency bin $Y[3]$, etc.

For the following explanations, it is assumed that the rotation of the phase $\varphi_{TSG}[k]$ covers one full rotation in N steps of $2\pi/N$ and the frequency bin of interest is the first frequency bin n=1. In this example, the spectral value $Y[1]$ of the first frequency bin can be calculated as follows:

$$Y[1] = \Sigma_{k=0}^{N-1} M_c[k] \cdot W_N^k = M_c^T \cdot W_N \qquad (28)$$

wherein $M_c$ denotes a vector including the sequence $M_c[k]$ and $W_N$ denotes a vector including the weights $W_N^k$ (for k=0, 1, . . . , N−1). That is:

$$M_c = \begin{pmatrix} M_c[0] \\ \vdots \\ M_c[N-1] \end{pmatrix} \text{ and } W_N = \begin{pmatrix} W_N^0 \\ \vdots \\ W_N^{N-1} \end{pmatrix}. \qquad (29)$$

In equation 28, the superscript T denotes the transposed. It can be observed that the discrete Fourier Transform may be replaced by the vector multiplication of equation 29.

In accordance with one example, the parameter N may be chosen as eight (N=8) for phase increments of $2\pi/8$ (i.e., 45°), which means that eight measurement cycles are performed to obtain the eight measured values $M_c[0], \ldots, M_c[7]$ for each channel TXc. In this example, the resulting weight vector $W_8$ has a simple structure, namely:

$$W_8 = \begin{pmatrix} 1 \\ \sqrt{2} - j\sqrt{2} \\ -j \\ -\sqrt{2} - j\sqrt{2} \\ -1 \\ -\sqrt{2} + j\sqrt{2} \\ j \\ \sqrt{2} + j\sqrt{2} \end{pmatrix}. \quad (30)$$

In accordance with another example, the parameter N may be chosen as four (N=4) for phase increments of $2\pi/4$ (i.e., 90°), which means that four measurement cycles are performed to obtain the four measured values $M_c[0], \ldots, M_c[4]$ for each channel c. In this example, the resulting weight vector $W_4$ has an even simpler structure, namely:

$$W_4 = \begin{pmatrix} 1 \\ -j \\ -1 \\ j \end{pmatrix}. \quad (31)$$

It is noted, that in the latter example (equation 31) no multiplication have to be performed, and the spectral value Y[1] of the first frequency bin n=1 may be obtained by two simple additions/subtractions. That is, for each channel TXc:

$$Y[1] = M_c^T \cdot W_4 = \underbrace{M_c[0] - M_c[2]}_{Re\{Y[1]\}} + j \cdot \underbrace{(M_c[3] - M_c[1])}_{Im\{Y[1]\}}. \quad (32)$$

In the above equation 32, $Re\{\bullet\}$ and $Im\{\bullet\}$ denote the real and the imaginary part of the complex-valued spectral value Y[1]. The sought amplitude value $2A_{TXc}$ of the sequence $M_c[k]$ (see equations 24) can be determined from the magnitude of the spectral value Y[1], namely |Y[1]|, and the corresponding phase value $\varphi_{TXc}$ (for channel TXc) can be calculated using the following known relations:

$$2A_{TXc} = \frac{2}{N}|Y[1]| = \frac{2}{N}\sqrt{Re\{Y[1]\}^2 + Im\{Y[1]\}^2} \quad (33)$$

$$\phi_{TXc} = \tan^{-1}(Im\{y[1]\}/Re\{Y[1]\}). \quad (34)$$

It is noted, that in a general case N complex-valued multiplications and N–1 complex-valued additions are needed to calculate the spectral value Y[1] wherein each complex-valued multiplication entails two real-valued multiplications and two real-valued additions. As discussed above, the number of calculations significantly reduces for specific values of N. Particularly for N=4. the calculations become trivial and only two real-valued additions remain for calculating the spectral value Y[1] (see equation 32). Although a sequence $M_c[k]$ of only four values (i.e., N=4 and k=0, . . . , 3) may be sufficient to estimate the phase value for a channel, a longer sequence (e.g., N=8) with more values may yield better (more precise) results. As shown in equation 30, the values in the weight vector $W_N$ are not trivial for higher parameters N (as compared to the case N=4). In the case of N=8 the factor $\sqrt{2}$ may be stored in a memory as a pre-calculated numerical value. For higher values of the parameter N (N>8), more factors need to be pre-calculated and stored.

The complexity of the amplitude and phase estimation— also for higher values of N—may be achieved when covering two or more full rotations of the phase. If, in accordance with a further example, the parameter N is chosen as eight (N=8) for phase increments of $4\pi/8$ (i.e., 90°), the phases are distributed over two full rotations, i.e., two full rotations are covered. Accordingly, eight measurement cycles are performed to obtain the eight measured values $M_c[0], \ldots, M_c[7]$ for each channel TXc. In this example, the spectral value Y[2] is relevant, $$Y[2] = \Sigma_{k=0}^{8-1} M_c[k] W_8^{2 \cdot k} = M_c^T \cdot W_8, \quad (35)$$

and the resulting weight vector $W_8$ has a simple structure, namely:

$$W_8 = \begin{pmatrix} W_8^0 \\ W_8^2 \\ W_8^4 \\ W_8^6 \\ W_8^8 \\ W_8^{10} \\ W_8^{12} \\ W_8^{14} \end{pmatrix} = \begin{pmatrix} 1 \\ -j \\ -1 \\ j \\ 1 \\ -j \\ -1 \\ j \end{pmatrix}. \quad (36)$$

For N=16 and increments of $8\pi/16$, four full rotations of the phase are performed and the relevant spectral value is Y[4], wherein the corresponding weight vector $W_{16}$ remains trivial, i.e., $W_{16} = [W_N^{4 \cdot k}]$.

Summarizing the above, calculation of the whole spectrum, e.g., using an FFT algorithm, may be avoided if the measured sequence covers an integer multiple of a full phase rotation (a full rotation means a rotation of $2\pi$ or 360°). That is, for a sequence of N values (obtained in N measurement cycles) the phase increment between the samples is an integer multiple of $2\pi/N$. If the measurements are distributed over one full phase rotation, the first frequency bin Y[1] is relevant (Y[0] represents the DC offset and is ideally zero). Generally, if the measurements are distributed over u full phase rotations, frequency bin u is relevant, i.e., Y[u] is relevant. As mentioned the zeroth frequency bin Y[0] represents a DC offset which is ideally zero. The weight vector $W_N$ becomes trivial, if the phase increments between the samples equal $\pi/2$ (90°). In both cases, the calculations needed to determine the spectral value of the sought frequency bin can be very efficiently implemented in hardware with less complexity than conventional FFT algorithms. In one example, a hardware-implemented CORDIC algorithm is used.

Figure 13:
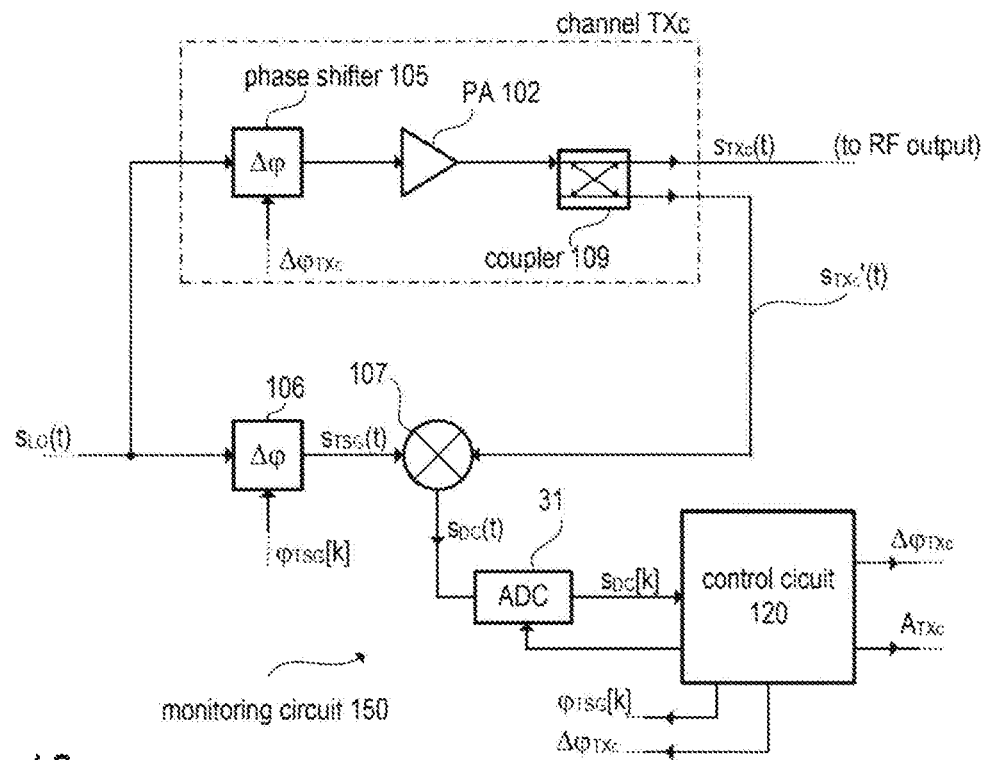
FIG. 13 is a block diagram illustrating another example of a monitor circuit that may be used to successively sense the phase lags and gains caused by two or more RF channels of an RF circuit.

It is noted, that the herein-described approach for estimating phase and amplitude of sinusoid sequences—such as the sequences $M_{01}[k]$, $M_{02}[k]$, etc. that cover an integer number of periods (i.e., an integer number of full phase rotations) may not only be applied in a system shown in FIGS. 5, 8, and 9, but can also be applied in other systems, in which the phases of the individual channels are measured subsequently (channel-wise). An example of such a system is illustrated in FIG. 13.

Accordingly, the approach explained above with reference to equations 26 to 36 is not limited to examples in which the RF output signals from multiple channels are combined as described above with reference to FIGS. 5 to 19. The approach can generally be used to evaluate phases and amplitude values of signals having sinusoidal waveforms (such as, e.g., $M_{o1}[k]$, $M_{o2}[k]$, etc.). FIG. 13 illustrates a block diagram illustrating one further example of an RF circuit with multiple RF channels for generating multiple RF output signals. Only one channel TXc of c channels is depicted to keep the illustration simple. Similar as in the example of FIG. 8, the local oscillator signal $s_{LO}(t)$ is supplied as input signal to the RF channel TXc as well as to the monitor circuit 150. As in the previous examples, the RF channel TXc includes a phase shifter 105 (phase shift $\Delta\varphi_{TXc}$) and an amplifier 102 in order to phase-shift and amplify the local oscillator signal $s_{LO}(t)$. The phase-shifted and amplified signal $s_{TXc}(t)$ is supplied as output signal at an output port of the RF channel TXc, wherein a coupler 109 is included in the RF channel TXc configured to provide a fraction of the output signal $s_{TXc}(t)$ as scaled output signal $s_{TXc}'(t)$ to the monitor circuit 150 for the determination of the phase and the amplitude of the output signal $s_{TXc}(t)$. The scaled output signal is denoted as $s_{TXc}'(t)$ and has a fraction of the signal power of the output signal $s_{TXc}(t)$.

The monitor circuit 150 includes a phase shifter 106 (phase shift $\Delta\varphi_{TSG}$), which is configured to phase shift the local oscillator signal $s_{LO}(t)$. The output signal is denoted as reference signal $s_{TSG}(t)$ (see equation 5). The monitor circuit 150 further includes phase mixer 107 that is configured to mix the reference signal $s_{TSG}(t)$ with the (scaled) output signal $s_{TXc}'(t)$. As both signals $s_{TSG}(t)$ and $s_{TXc}'(t)$ have the same frequency $f_{LO}$, the output signal of the phase mixer 107 is a DC-signal $s_{DC}(t)$, which represents the phase of the output signal $s_{TXc}(t)$ relative to the phase of the reference signal $s_{TSG}(t)$. Analogously to equation 1, the output signal $s_{TXc}(t)$ can be written as:

$$s_{TXc}(t)=A_{TXc}\cdot\cos(2\pi f_{LO}t+\varphi_{TXc}+\Delta\varphi_{TXc}), \quad (37)$$

wherein $\Delta\varphi_{TXc}$ is the phase shift caused by phase shifter 105 and $\varphi_{7-xc}$ is the phase shift caused by further circuit components in the signal path from the local oscillator to the output of the RF channel TXc. $A_{TXc}$ denotes the amplitude of the output signal $s_{TXc}(t)$. Similar to equations 6 and 7, the mixer output signal $s_{DC}(t)$ can be calculated as follows:

$$s_{DC}(t)\approx A_{TXc}\cdot\cos(\varphi_{TSG}-\Delta\varphi_{TXc}-\varphi_{TXc}). \quad (38)$$

It is to be noted that only one output channel is active in the present example, while the other channels are inactive and not generating an RF output signal.

The analog signal DC may be sampled (e.g., by sensor ADC 31) at various different phase shift values $\varphi_{TSG}$ and $\Delta\varphi_{TXc}$ set by the phase shifters 106 and 105, respectively. The k-th sample of the resulting discrete sequence $M_c[k]$ is:

$$M_c[k] = s_{DC}(t_k) = s_{DC}[k] \approx A_{TXc} \cdot \cos\left(\underbrace{\varphi_{TSG}[k] - \Delta\varphi_{TXc}[k]}_{\Delta\varphi_c[k]} - \varphi_{TXc}\right). \quad (39)$$

The sequence $M_c[k]$ may herein be referred to as measured signal, wherein the phase difference $\varphi_{TSG}[k]-\Delta\varphi_{TXc}[k]$ may herein be referred to as phase offset $\Delta\varphi_c[k]$. It is noted that the phase offset $\Delta\varphi_c[k]$ can be set solely by the phase shifters 105 and 106, which may be controlled by control circuit 120.

Figure 14A:
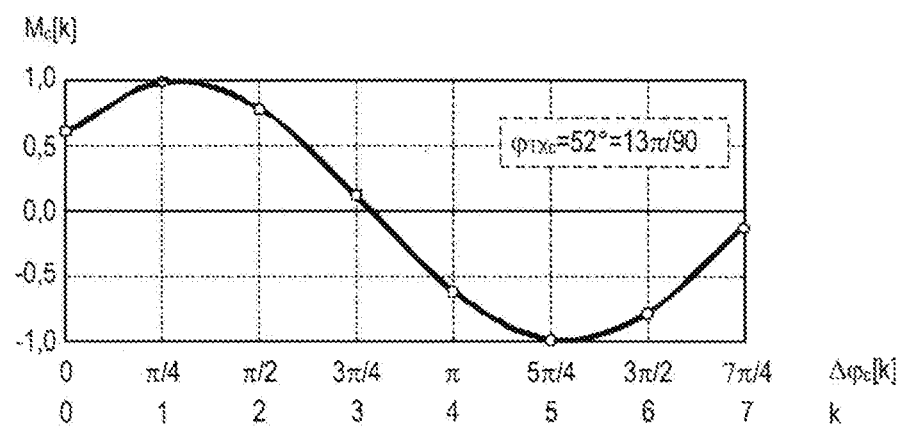
FIGS. 14A and 14B include diagrams illustrating a first example of a sequence of measured values and corresponding weight factors used for calculating a corresponding spectral value, respectively.

If the phase offset $\Delta\varphi_c[k]$ is successively rotated by equidistant phase steps, the measured sequence $M_c[k]$ is a discrete sinusoidal signal similar to the signals shown in the example of FIG. 6. Thus, the sensor ADC 31 takes a set of samples from the output of the phase mixer 107 that together form a measured sequence of samples. As a result, the measured sequence is a set of DC values representative of a sinusoidal signal of one sample period taken over $2\pi$. If the size of one phase step is an integer multiple of $2\pi/N$, wherein N is the number of measurement cycles and thus the number of samples in the sequence $M_c[k]$ (i.e., k=0, ..., N−1), the measured sequence $M_c[k]$ is distributed over one or more full periods (i.e., full phase rotations of $2\pi$). The diagram illustrated in FIG. 14A illustrates a measured sequence $M_c[k]$ with eight samples (i.e., k=0, ..., N−1), wherein these samples can be regarded as elements of the vector $M_c$ (see equation 28). For a successive, next measurement cycle the phase offset $\Delta\varphi_c[k]$ is increased by $2\pi/N=\pi/4$ (i.e., 45°). In the depicted example, the determined phase $\varphi_{TXc}$ is $1\pi/90$ (i.e., 52°). As can be seen from the diagram of FIG. 14A, one full period of a cosine sequence is obtained, and thus the relevant phase and amplitude information is in the first frequency bin Y[1] (frequency index n=1) of the corresponding discrete Fourier Transform as explained above.

Considering equations 27 and 30, the weight factor $W_8^k$ equals $e^{-j\cdot k\cdot \pi/4}$. The complex values of $W_8^k$ are illustrated in the diagram illustrated in FIG. 14B for k=0, ..., 7. The depicted values are the elements of the weight vector $W_8$ defined in equation 30. The spectral value Y[1] can be calculated in accordance with equation 28, and an estimation for the sought phase $\varphi_{TXc}$ value can be calculated from the spectral value Y[1] in accordance with equation 34. The corresponding amplitude can be calculated from the spectral value Y[1] in accordance with equation 33.

According to one implementation, the phase offset $\Delta\varphi_c[k]$ is stepwise rotated to cover one or more full rotations of $2\pi$ (i.e., 360°) and thus the step size is an integer multiple of $2\pi/N$, wherein N is the number of samples (measurement cycles). As defined in equation 39, the phase offset $\Delta\varphi_c[k]=\varphi_{TSG}[k]-\Delta\varphi_{TXc}[k]$ can be determined by both phase shifters 105 and 106. Therefore, a phase offset of $\pi/4$ can be obtained by setting the phase shifter 106 to $\varphi_{TSG}[k]=\pi/4$ and the phase shifter 105 to $\Delta\varphi_{TXc}[k]=0$. However, the same phase shift may be obtained by setting the phase shifter 106 to $\varphi_{TSG}[k]=\pi/2$ and the phase shifter 105 to $\Delta\varphi_{TXc}[k]=\pi/4$. In some implementations, both phase shifts $\varphi_{TSG}[k]$ and $\Delta\varphi_{TXc}[k]$ may be varied for setting a specific phase offset $\Delta\varphi_c[k]$ in order to test the functionality of both phase shifters 105 and 106. In other words, if the measured sequence $M_c[k]$ corresponds to the expected sinusoidal samples, it can be determined that both phase shifters 105 and 106 provide the expected phase offsets and are functioning and operating correctly.

The diagram illustrated in FIG. 15A illustrates another example of a measured sequence $M_c[k]$ with eight samples (i.e., k=0, N−1), wherein these samples can be regarded as elements of the vector $M_c$ (see equation 35). Between two successive measurement cycles the phase offset $\Delta\varphi_c[k]$ has been increased by $4\pi/N=\pi/2$ (i.e., 90°). Like in the previous example, the sought phase $\varphi_{TXc}$ is $13\pi/90$ (i.e., 52°). As can be seen from the diagram illustrated in FIG. 15A, two full periods of a cosine sequence are obtained, and thus the relevant phase and amplitude information is in the second frequency bin Y[2] (frequency index n=2) of the corresponding discrete Fourier Transform as explained above. Considering equations 27 and 35, the weight factor $W_8^{2k}$ equals $e^{-j\cdot k\cdot \pi/2}$. Again, the complex values of $W_8^{2k}$ are illustrated in the diagram illustrated in FIG. 15B for k=0, . . . 7. The depicted values are the elements of the weight vector $W_8$ defined in equation 36. The spectral value Y[2] can be calculated in accordance with equation 35, and an estimation for the sought phase $\varphi_{TXc}$ value can be calculated from the spectral value Y[2] in view of equation 34. The corresponding amplitude can be calculated from the spectral value Y[2] in view of equation 33.

Figure 14B:
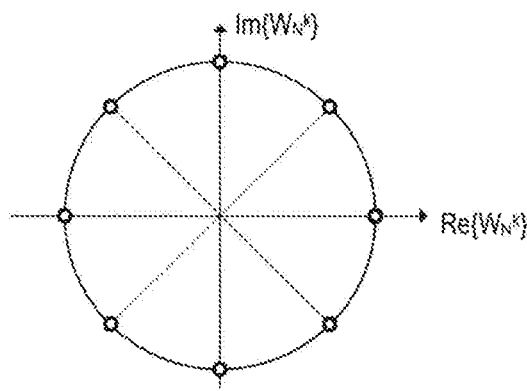

It is noted that the example illustrated in FIGS. 15A and 15B uses the same number of samples to estimate phase and amplitude of the measured sequence $M_c[k]$ as in the previous example illustrated in FIGS. 14A and 14B. However, the weight vector $W_8$ takes a more simple form in the example illustrated in FIGS. 15A and 15B (see equation 36) as already discussed above. This is due to the fact that the step size of the phase offset $\Delta\varphi_c[k]$ equals $\pi/2$ and the cosine of integer multiples of $\pi/2$ can only assume the values 0, 1, and −1. Accordingly, the elements of the weight vector $W_8$ have imaginary and real parts that are either or 1 or −1.

As mentioned above, a specific phase offset $\Delta\varphi_c[k]$ can be set using both phase shifters 105 and 106. The tables shown in FIGS. 16 and 17 illustrates two different settings for the phase shifters 105 and 105 to obtain equally spaced phase offsets $\Delta\varphi_c[k]$ when successively acquiring measured values $M_c[k]$ in accordance with the approach shown in FIG. 15A. In the example of FIG. 16, the phase shift $\Delta\varphi_{TXc}[k]$ generated by phase shifter 105 remains zero, while the phase rotation is solely accomplished by phase shifter 106 that increases the phase shift $\Delta\varphi_{TSG}[k]$ stepwise by $\pi/2$ (i.e., 90°). Thus, the phase offset $\Delta\varphi_c[k]$ is rotated by two full rotations while obtaining a sequence $M_c$ of eight measured values $M_c[k]$ (for k=0, . . . , 7). In another example the phase shift $\Delta\varphi_{TXc}[k]$ generated by phase shifter 105 is set to zero while obtaining the first four measurements $M_c[k]$ (for k=0, . . . , 3) and set to $\pi/4$ (i.e., 45°) while obtaining the remaining measurements $M_c[k]$ (for k=4, . . . , 7). At the same time, the phase shift $\Delta\varphi_{TSG}[k]$ generated by the phase shifter 106 is stepwise increased by $\pi/2$ starting at zero while obtaining the first four measurements $M_c[k]$ (for k=0, . . . , 3) and stepwise increased by $\pi/2$ starting at $\pi/4$ while obtaining the remaining measurements $M_c[k]$ (for k=4, . . . , 7). This situation is illustrated in FIG. 17. It is understood that phase offsets of $2\pi$ (i.e., 360°) and integer multiples of $2\pi$ correspond to a phase offset of zero. Accordingly, a subtraction $\Delta\varphi_c[k]=\Delta\varphi_{TSG}[k]-\Delta\varphi_{TXc}[k]$ resulting in $\psi\pm2\pi$ is identical to a subtraction $\Delta\varphi_c[k]=\Delta\varphi_{TSG}[k]-\Delta\varphi_{TXc}[k]$ resulting in $\psi$ (wherein $\psi$ may by an arbitrary angle).

While the above specification describes the use of the phase shifter 106 and the phase mixer 107 to obtain predetermined and exact phase settings in the transmission paths TXc and to monitor the phases in the transmission paths TXc, the following describes a concept to correct for a non-ideal behavior of the phase shifter 106 implemented as an IQ modulator which may influence the phase settings and how to address and compensate for it. The concept described below may in general be applied to any system in which a phase shifter needs to be corrected or calibrated utilizing, in addition to the phase shifter (IQ modulator) to be compensated, a phase mixer. The described concept provides in the described system the advantage that the required components are already available due to the above described concept for monitoring the phases of the TXc channels.

Based on the embodiment shown in FIGS. 8 and 9 and the embodiment shown in FIG. 13, a reference signal (i.e., LO signal $s_{LO}(t)$) is generated by the local oscillator 101, where the reference signal is configured as a continuous-wave signal. The LO signal $s_{LO}(t)$ is processed in the transmission signal path of one or more TX channels to generate a continuous-wave transmission signal that is radiated by the TX antenna 5. The reference signal (i.e., LO signal $s_{LO}(t)$) is also provided along a test path to the phase shifter 106. The test path is used to monitor a phase of the transmission signal. Thus, before leaving the radar chip to be sent to the TX antenna 5, a portion of the continuous-wave transmission signal is coupled out by coupler 109 as a continuous-wave transmission monitoring signal $s_{TX01}'(t)$, $s_{TX02}'(t)$, . . . , $s_{TXc}'(t)$). The transmission monitoring signal is fed to the RF port of a phase mixer 107. The LO input of the phase mixer 107 is also fed with the LO signal $s_{LO}(t)$, whose phase is rotated by a unique phase shift $\Delta\varphi$ to generate a phase-shifted signal $s_{TSG}(t)$. This phase shift is produced by a test modulator (i.e., phase shifter 106).

The phase-shifted signal and the transmit monitoring signal, being derived from the same reference signal, have the same frequency. Two signals with the same frequency mixed together produce a DC signal. Thus, when the phase-shifted signal $s_{TSG}(t)$ and the transmitter monitoring signal $s_{TXc}'(t)$ are mixed together by the phase mixer 107, the phase mixer 107 generates a DC signal, mixer output signal $s_{DC}(t)$, at its output. In other words, a DC level of the resulting down-converted IF signal $s_{DC}(t)$ is output from the phase mixer 107 and is measured by the sensor ADC 31. The sensor ADC 31 outputs DC sample values $s_{DC}[k]$, which are the measured DC values (sampled values) of the mixer output signal $s_{DC}(t)$).

This DC sample value $s_{DC}[k]$ depends on the phase difference (i.e., the phase offset $\Delta\varphi_c[k]$) between the signal in the transmit path (i.e., combined signal $s_{SUP}$ (t) in FIG. 8 and the phase-shifted signal $s_{TSG}(t)$ used for down-conversion, or the transmitter monitoring signal $s_{TXc}'(t)$ in FIG. 13 and the phase-shifted signal $s_{TSG}$ (t) used for down-conversion. Here, if the combined signal $s_{SUP}(t)$) is used, only one TX channel is active at a time such that the combined signal $s_{SUP}(t)$) is representative of only that active TX channel (e.g., RF output signals $s_{TX01}'(t)$, $s_{TX02}'(t)$, . . . , $s_{TXc}'(t)$).

The procedure is repeated for several values of the phase shift $\Delta\varphi$ between 0 and $2\pi$. For instance, the phase offset $\Delta\varphi_c[k]$ may be successively rotated by equidistant phase steps by rotating the phase $\varphi_{TSG}[k]$ of the phase shifter 106 by equidistant phase steps to cover one full rotation in N steps of $2\pi/N$. In the following examples, N is equal to eight but is not limited thereto. As a result of the eight equidistant phase steps of phase $\varphi_{TSG}[k]$, the measured sequence $M_c[k]$ of ADC sample values $s_{DC}[k]$ is a discrete sinusoidal signal comprising of eight ADC sample values. In particular, the measured DC sample values when plotted over $\Delta\varphi$ follow a sine. Thus, the phase-shifted signal is shifted over 360 degrees defining one period, and the sequence of DC sample values is taken over the one period.

The phase of this sine corresponds to the phase difference (i.e., the phase offset $\Delta\varphi_c[k]$) between the signal in the transmit path (i.e., combined signal $s_{SUP}(t)$ or $s_{TXc}'(t)$ and the phase-shifted signal $s_{TSG}(t)$ used for the down-conversion). The measurement is repeated for all TX antennas, yielding NTx phase values, where NTx is the number of transmit antennas. Comparing these NTx phase values allows for TX phase calibration by the control circuit 120 by adjusting the phase shifters 105 in the individual RF TX paths properly.

Figure 18:
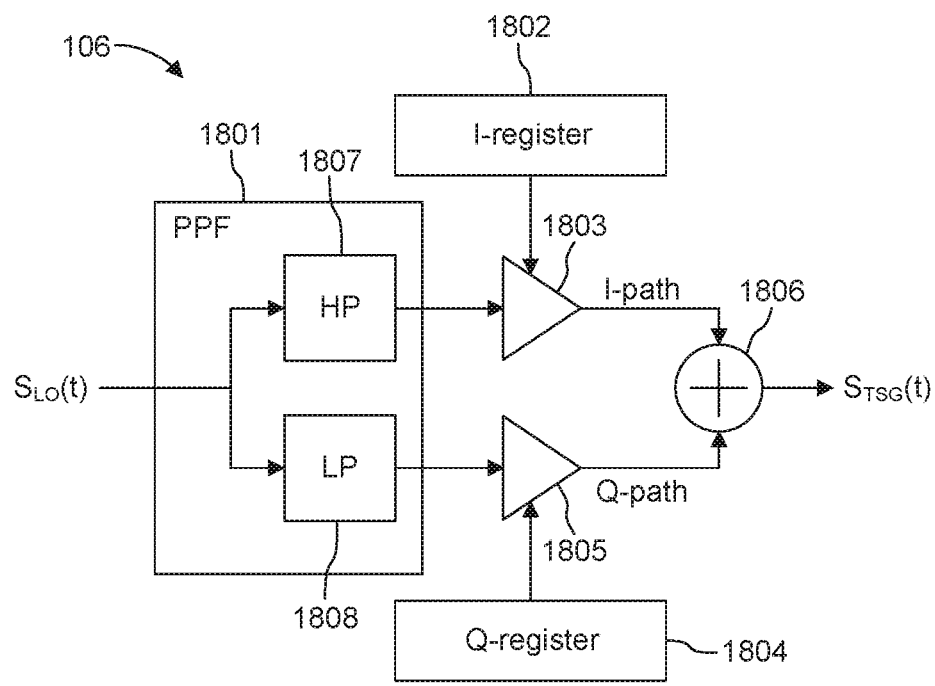
FIG. 18 illustrates a schematic diagram of the phase shifter according to one or more embodiments.

FIG. 18 illustrates a schematic diagram of the phase shifter 106 according to one or more embodiments. In this example, the phase shifter 106 is an I/Q-modulator (IQM) but may be any phase shifter that produces a 2-period phase error due to a magnitude or a phase mismatch. The phase shifter 106 includes a polyphase filter (PPF) 1801, an I-register 1802 coupled to a variable gain amplifier 1803, a Q-register 1804 coupled to a variable gain amplifier 1805 and an adder 1806. The output signal of the phase shifter 106 (i.e., of the adder 1806) is the phase-shifted signal $s_{TSG}$ (t).

The PPF 1801 includes a high-pass (HP) filter 1807 and a low-pass (LP) filter 1808 that are configured to generate orthogonal output signals of equal magnitude. These signals are then amplified with a respective VGA 1803 or 1805. The gain of these VGAs 1803 and 1805 is defined by the according register values [−128, +127] input by their respective I-register 1802 or Q-register 1804. The sum of the VGA outputs is the phase-shifted signal $s_{TSG}$(t) that is provided to the phase mixer 107, where the phase shift of the phase-shifted signal $s_{TSG}$(t) is defined by the register values of registers 1802 and 1804. Thus, the phase-shifted signal $s_{TSG}$(t) is phase shifted relative to the input signal LO signal $s_{LO}$(t)) of the phase shifter 106 (i.e., the input of the PPF 1801).

The operation of the PPF 1801 will now be described. Ideally, the HP filter 1807 and the LP filter 1808 have the same cutoff frequency. At this cutoff frequency, the HP filter 1807 produces a phase shift of +45°. On the other hand, the LP filter 1808 produces a phase shift of −45°. Since the total phase difference between I-path and Q-path is 90°, their output signals are orthogonal. However, there are some implications with the PPF 1801. For example, if the HP filter 1807 and the LP filter 1808 are not operated exactly at the cutoff frequency, the output signals thereof won't be orthogonal. Similarly, if temperature-dependent components or process variations shift the cutoff frequencies, the output signals will not be orthogonal either. In addition to the filter output signals not being orthogonal, their amplitudes won't be equal anymore either, which is required for a correct functionality of the IQM 106. This is generally true for any possible kind of PPF implementation.

As a result, a non-ideal PPF can be modelled by introducing a magnitude and phase mismatch between the I-path and the Q-path after the PPF 1801. The effects of these PPF mismatches on the IQM's functionality are detailed in the following. For this, the input signal $s_{LO}$(t) of the phase shifter 106 is kept constant, and the register values of the I-register 1802 and the Q-register 1804 are varied such that the ideal phase shifter output, phase-shifted signal $s_{TSG}$(t), has constant magnitude and its phase is rotated on a full circle with steps of, for example, 10°.

Figure 19A:
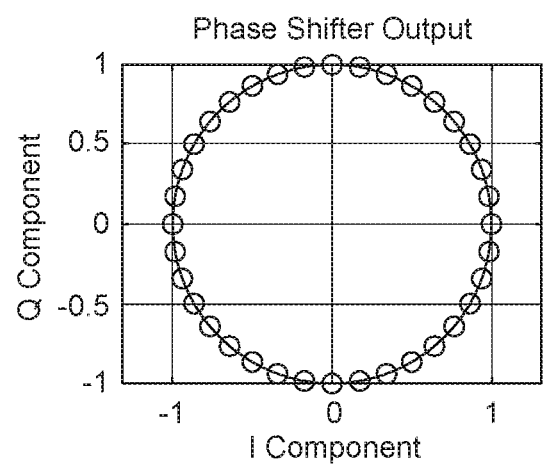
FIG. 19A illustrates an ideal phase shifter output according to one or more embodiments.

For an ideal IQM, the output signals follow the desired 10° phase steps, as shown in FIG. 19A. Here, the magnitude is constant as described above.

Figure 19B:
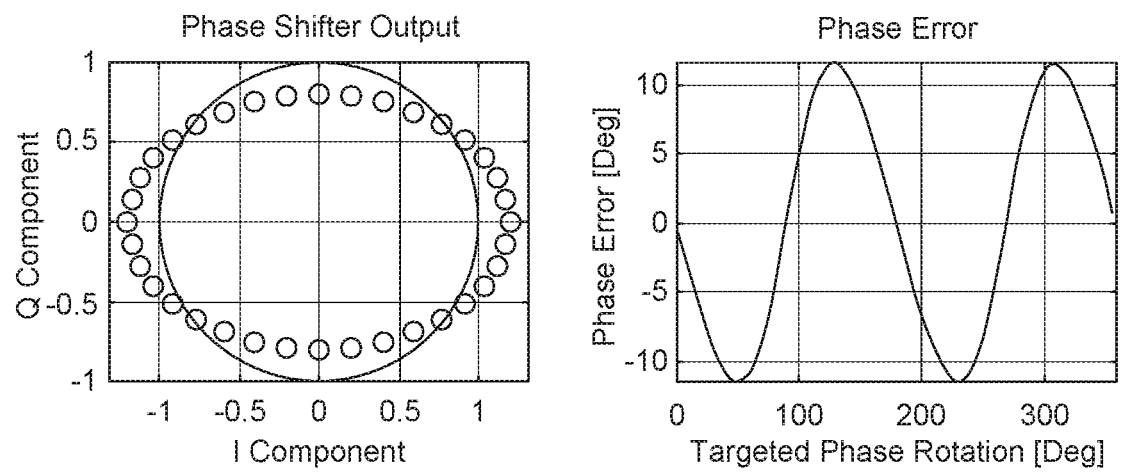
FIG. 19B illustrates a non-ideal phase shifter output and a phase error according to one or more embodiments.

When a magnitude mismatch at the PPF 1801 is present (i.e., the magnitudes of the signals output from the HP and LP filters 1807 and 1808 are not equal), the constellation points are stretched/compressed along the I-axis and the Q-axis, as shown in the left portion of FIG. 19B. The resulting phase error at the phase shifter output $s_{TSG}$(t) follow a two periods waveform. It can be shown that, in this case, the phase error is always zero at n*90°, with n being an integer, and that the phase error is well-approximated by a sine wave, as shown in the right portion of FIG. 19B.

Figure 19C:
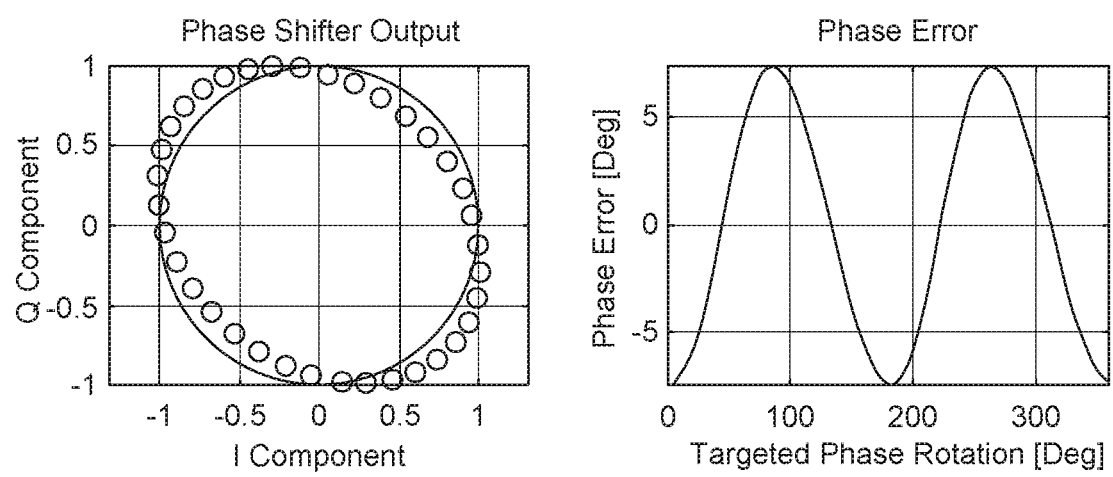
FIG. 19C illustrates a non-ideal phase shifter output and a phase error according to one or more embodiments.

Alternatively, when a phase mismatch at the PPF 1801 is present (i.e., the phases of the signals output from the HP and LP filters 1807 and 1808 are not orthogonal), the constellation points are stretched and compressed along the 45°-axis or the 135°-axis, respectively, as shown in left portion of FIG. 19C. The resulting phase error at the phase shifter output $s_{TSG}$(t) again follows a two periods waveform. It can be shown that, in this case, the phase error is always zero for phases of 45°+n*90°, with n being a number, and that the phase error is well-approximated by a cosine, as shown in the right portion of FIG. 19C.

On top of the phase error at the phase shifter output $s_{TSG}$(t), there will also be a magnitude error at the phase shifter 106 output. However, this magnitude error is not considered any further. The reason for this is that the input of the phase mixer 107 that is connected with the phase shifter 106 is operated in saturation. Hence, magnitude variations at this input (as long as they are not severe) do not alter the output signal $s_{DC}$(t) of the phase mixer 107.

Figure 20:
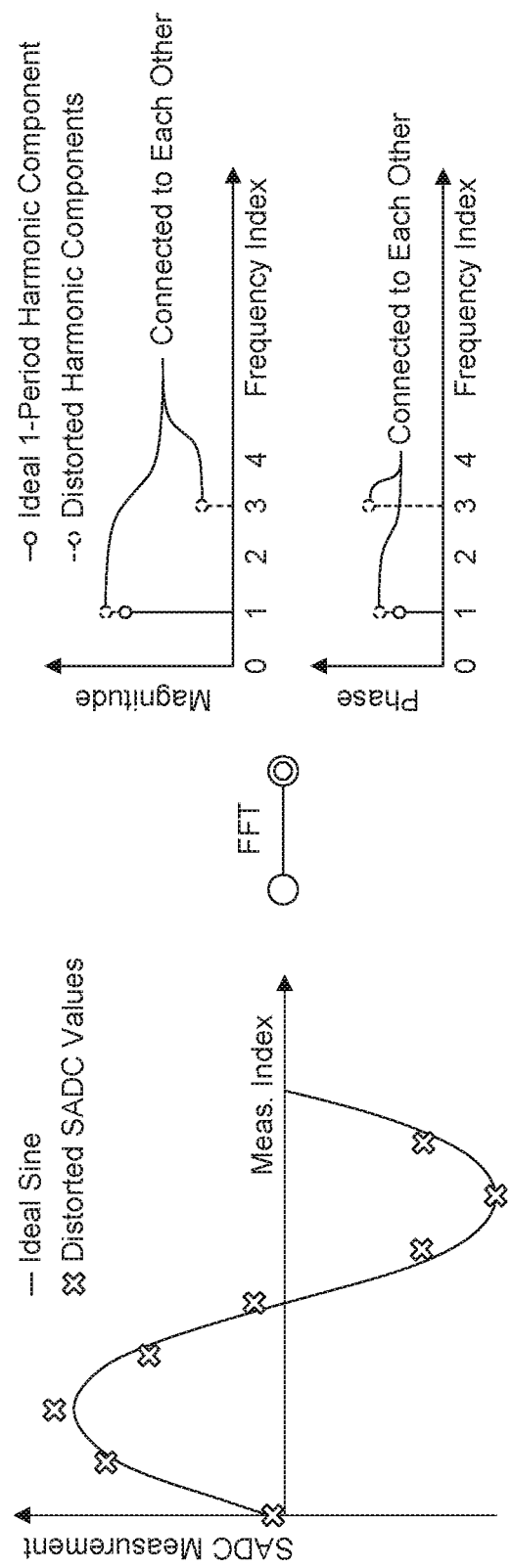
FIG. 20 illustrates Fourier components of sensor ADC (SADC) measurements with a 2-period phase error according to one or more embodiments.

FIG. 20 illustrates Fourier components of sensor ADC (SADC) measurements with a 2-period phase error according to one or more embodiments. The left diagram in FIG. 20 illustrates an ideal sine for SADC measurements with one period (i.e., samples for eight equidistant phase steps of phase $\varphi_{TSG}$[k] over 360°) and distorted SADC values due to a phase and/or magnitude mismatch at the phase shifter 106. In other words, the left diagram in FIG. 20 relates to using the samples shown in FIGS. 14A and 15A as inputs to a discrete Fourier Transform (DFT) algorithm described below and further shows the distortion in the samples as a result of the non-ideal behavior of the phase shifter 106.

Here, each SADC value corresponds to a sample taken for one of the eight equidistant phase steps. The SADC values are DC sample values $s_{DC}$[k] at the output of the sensor ADC 31. The DC sample values $s_{DC}$[k] may represent a SADC measurement sequence $M_c$[k] having a pattern with one period in duration. For example, the pattern may be a sinusoidal pattern having one period in duration. In the event that a 2-period phase error is present, the sinusoidal pattern may be a non-ideal sinusoidal pattern, meaning that the pattern is distorted and does not follow an ideal sinusoidal pattern.

A DFT algorithm (e.g., a fast Fourier transform (FFT) algorithm) may be applied to the SADC measurement sequence $M_c$[k] to estimate phase and amplitude (magnitude) values of the TX channel. As a result of the conversion, a plurality of DFT bins with corresponding DFT bin values are generated. Each DFT bin value may include a magnitude value and a phase value. In addition, if the DFT algorithm is an FFT algorithm, a DFT bin may be referred to as an FFT bin and a DFT bin value may be referred to as an FFT bin value.

In particular, a plurality of Fourier components located at different harmonics, including a first harmonic component located at DFT bin 1 and a third harmonic component located at DFT bin 3, are generated by the DFT. These DFT bins follow a DC DFT bin (i.e., zero is the lowest bin frequency) that has an DFT bin value of zero since there is no DC value of an oscillating pattern. The zeroth bin in the DFT is DC (0 Hz), the first bin is located at Fs/N, where Fs is the sample rate and N is the size of the DFT. The next bin is located at 2*Fs/N, the third bin is located at 3*Fs/N, and so on.

Thus, the right side of FIG. 20 shows ideal and distorted magnitude and phase values of the sinusoidal SADC measurement sequence $M_c$[k] after which an DFT algorithm is applied thereto. In particular, the sinusoidal SADC measurement sequence $M_c$[k] provided by the sensor ADC 31 is converted by the monitor circuit 150 using a DFT (e.g., FFT) into frequency components, also referred to as harmonic components.

Considering an ideal sinusoidal SADC measurement sequence follows a sine with one period, a single first harmonic component exists at a first DFT bin 1 (frequency index 1) when there is no phase or magnitude mismatch at the phase shifter 106. In general, a DFT bin is a harmonic component sample and may also be referred to as an FFT bin. Thus, the relevant phase and magnitude information is in the first DFT bin 1 where the dominant signal component of the sinusoidal SADC measurement sequence resides.

The phase of this first harmonic component is the measured phase difference between the RF and LO inputs of the phase mixer 107 (i.e., the phase difference between the transmitter monitoring signal $s_{TXc}'(t)$ and the phase-shifted signal $s_{TSG}(t)$).

When a PPF magnitude and/or phase mismatch is present, a 2-period phase error is introduced at the output of the phase shifter 106. As a result, the sinusoidal SADC measurement sequence $M_c[k]$ of the DC sample values $s_{DC}[k]$ is distorted and is not limited to a single first harmonic component as would be the case with an ideal phase shifter. Instead the distorted sinusoidal SADC measurement sequence has distorted harmonic components at the first harmonic component and at a third harmonic component (i.e., at the first DFT bin 1 and the third DFT bin 3, respectively).

In particular, the first harmonic component features a phase error. In fact, the ideal first harmonic component is distorted by the phase error. This phase error directly influences the transmission Tx phase measurement/calibration. Another consequence of the PPF magnitude and/or phase mismatch is that the sinusoidal SADC measurement sequence $M_c[k]$ contains a third harmonic component at the third DFT bin 3 (frequency index 3).

The third DFT bin 3 is separated by two DFT bins (i.e., two harmonic components) from the first DFT bin 1 (i.e., the first harmonic component) due to the 2-period phase error. This third harmonic component and the phase error introduced in the first harmonic component are directly related to each other. In particular, both magnitude and phase values of the first harmonic component are distorted by the 2-period phase error. In addition, magnitude and phase values are now present at the third harmonic component (i.e., at the third DFT bin) in the form of error components. Hence, the monitor circuit 150 is configured to analyze the error components at the third DFT bin in order to generate compensated phase information of a transmission channel.

Specifically, the monitor circuit 150 configured to apply a DFT (e.g., an FFT) to the sequence of DC sample values to generate a plurality of DFT bins with corresponding DFT bin values, and use DFT bin values of the first DFT bin and the third DFT bin to generate compensated phase information of the transmission channel. These DFT bin values may be referred to as a first DFT bin value and a third DFT bin value, respectively.

The first DFT bin value represents a first harmonic component of the sequence of DC sample values located at a first DFT bin that follows a DC DFT bin and the third DFT bin value represents a third harmonic component of the sequence of DC sample values located at a third DFT bin that follows the DC DFT bin. Thus, the first DFT bin is located adjacent to and between the DC DFT bin (DC harmonic component) and a second DFT bin (second harmonic component), and the third DFT bin is located adjacent to and between the second DFT bin and a fourth DFT bin (fourth harmonic component).

The first harmonic component includes a measurement component and a first error component of the sequence of DC sample values and the third harmonic component includes a second error component of the sequence of DC sample values, the second error component being related to the first error component based on a predefined relationship. The monitor circuit 150 is configured to perform a spectral analysis by measuring the second error component to derive the first error component based on the second error component and the predefined relationship. The monitor circuit 150 is further configured to subtract the first error component from the first harmonic component to generate the compensated phase information.

The monitor circuit 150 may then provide the compensated phase information to the control circuit 120, which is configured to adjust a phase-shift setting of a transmission phase shifter 105 of a corresponding transmission channel based on the compensated phase information.

In summary, the monitor circuit 150 is configured to subtract the estimated phase error from the first harmonic component to obtain a compensated first harmonic component, and ultimately to obtain a better Tx phase measurement/calibration. The compensated phase information is provided to the control circuit 120, which then uses the compensated phase information to adjust the phase shift values $\Delta\varphi_{TX01}, \Delta\varphi_{TX02}, \ldots, \Delta\varphi_{TXc}$ for the phase shifters 105 of the channels TX01, TX02, ..., TXc.

In view of the above, by varying the register values of the I-register 1802 and the Q-register 1804 with respect to each other, the phase of the phase shifter 106 is rotated 360 degrees in equidistant steps to obtain a plurality of SADC values that form a sinusoidal SADC measurement sequence. The sinusoidal SADC measurement sequence output by the SADC 31 is converted into the frequency domain by the monitor circuit 150 using a DFT. The DFT converted sinusoidal SADC measurement sequence has a first harmonic component that is affected by a 2-period phase error that is introduced by the phase shifter 106 due to a phase and/or magnitude mismatch. As a result, the first harmonic component contains an error component that distorts the measurement, both in magnitude and phase.

The DFT converted sinusoidal SADC measurement sequence also includes a third harmonic component that is related to the error component at the first harmonic component. In particular, a main contribution of phase error is located at the third DFT bin. The third DFT bin has three times the frequency of the first DFT bin. It is noted that four DFT bins exist due to there being eight SADC samples. Thus, the number of DFT bins is half the number of SADC samples. Regardless of the number of samples, or bins, the major contribution of phase error is always located at the 3rd DFT bin due to the phase error of the phase shifter 106 being related to certain frequencies, mainly the third DFT bin with some, but related contribution at the first DFT bin. There may be insignificant contributions at other DFT bins as well. The magnitude and phase values of the third harmonic component have a predefined relationship with the magnitude and phase values of the first harmonic component, respectively.

It is also noted that DFT bins include a DC bin (DFT bin 0), a first DFT bin having a first harmonic component, a second DFT bin having a 2-period harmonic component, a third DFT bin having a third harmonic component, and so on. The DC component at the DC DFT bin is zero since in the measurement signal made up of a plurality of ADC samples is sinusoidal.

The monitor circuit 150 determines the third harmonic component for both magnitude and phase of the DFT converted sinusoidal SADC measurement sequence, and applies a known relationship with the error component located in the first harmonic component to derive the error component in both the magnitude and phase. The monitor circuit 150 is further configured to subtract the derived error component from first harmonic component of the measurement signal (i.e., of the magnitude and the phase) in order to generate a compensated first harmonic component (i.e., to generate compensated phase information). Thus, the monitor circuit uses the third DFT bin to remove an error in the desired signal located at the first DFT bin.

As a result, the phase of the Tx monitoring signal coupled out of the transmission signal and provided to the phase mixer 107 is measured with a higher accuracy. Based on this measurement of the compensated phase of the Tx monitoring signal, a phase shift setting of the phase shifter 105 is modified to phase balance the TX channel with the other TX channels. That is, the phase of the phase shifter 105, having a similar configuration to the phase shifter 106 shown in FIG. 18, may be adjusted by modifying the VGA gain values of the phase shifter 105.

When performing phase balancing, the monitor circuit 150 may test each transmit signal path TX1, TX2, ... TXc sequentially. For example, transmit signal path TX1 may be tested based on the described method to determine a phase value of TX1 by activating channel TX1 and deactivating the remaining TX channels. Similarly, transmit signal path TX2 may be tested based on the described method to determine a phase value of TX2 by activating channel TX2 and deactivating the remaining TX channels. Then, the monitor circuit 150 is configured to compare the phase values between the two transmit paths TX1 and TX2, adjust the phase shift of one or more of the phase shifters 105 such that the phase values are balanced/matched (matched phase shift for phase shifters 105 in the transmit channels TX1, TX2, etc.) The control circuit 120 then modifies phase shifter values $\Delta\varphi_{TX01}$, $\Delta\varphi_{TX02}$, ..., $\Delta\varphi_{TXc}$ for the phase shifters 105 according to the adjusted phase shifts.

The ideal SADC measurements (i.e. phase mixer 107 output values value $s_{DC}[k]$) can be described as follows:

$$SADC[k] = \tfrac{1}{2} A_{Tx} A_{TST} \cos(\alpha_{Tx} - \alpha_{TST}[k]), \quad (40)$$

where $A_{Tx}$ and $A_{TST}$ describe the RF and LO input magnitude values at the phase mixer 107 (i.e., of the transmitter monitoring signal and the phase-shifted signal, respectively), $\alpha_{TX}$ represents the phase at the RF input of the transmitter monitoring signal, and where the phase of the LO input $\alpha_{TST}[k]$ is rotated a full circle in eight steps:

$$\alpha_{TST}[k] = -2\pi \frac{k}{8} \text{ for } k = 0 \text{ to } 7. \quad (41)$$

The negative sign indicates that the phase shift of the phase shifter 106 is rotated clockwise.

This expression is modified to account for PPF magnitude and/or phase mismatch. Such a mismatch produces a phase error with 2-periods. This can be generally modelled at the first order as:

$$\alpha_{TST}[k] = -2\pi \frac{k}{8} + \hat{\alpha}_e \cos\left(4\pi \frac{k}{8} + \varphi_e\right). \quad (42)$$

Here, $\hat{\alpha}_e$ and $\varphi_e$ stand for an arbitrary magnitude and start phase of the phase error, respectively. Inserting Equation (42) into Equation (40) yields:

$$SADC[k] = \tfrac{1}{2} A_{Tx} A_{TST} \cos\left(\alpha_{Tx} + 2\pi \tfrac{k}{8} - \hat{\alpha}_e \cos\left(4\pi \tfrac{k}{8} + \varphi_e\right)\right) \quad (43)$$

A Taylor series expansion of first order around $\hat{\alpha}_e = 0$ yields:

$$SADC[k] = \quad (44)$$
$$\tfrac{1}{2} A_{Tx} A_{TST} \left(\cos\left(\alpha_{Tx} + 2\pi \tfrac{k}{8}\right) + \hat{\alpha}_e \sin\left(\alpha_{Tx} + 2\pi \tfrac{k}{8}\right) \cdot \cos\left(4\pi \tfrac{k}{8} + \varphi_e\right)\right)$$

This expression can be reformulated as:

$$SADC[k] = \tfrac{1}{2} A_{Tx} A_{TST} \cos\left(\alpha_{Tx} + 2\pi \tfrac{k}{8}\right) + \quad (45)$$
$$\tfrac{1}{2} A_{Tx} A_{TST} \hat{\alpha}_e \sin\left(\alpha_{Tx} + 2\pi \tfrac{k}{8}\right) \cdot \cos\left(4\pi \tfrac{k}{8} + \varphi_e\right)$$

Using $\sin x \cos y = \tfrac{1}{2}(\sin(x-y)+\cos(x+y))$, the right term can be rewritten as:

$$SADC[k] = \tfrac{1}{2} A_{Tx} A_{TST} \cos\left(\alpha_{Tx} + 2\pi \tfrac{k}{8}\right) \quad \rightarrow \text{Desired component} \quad (46)$$
$$\text{with 1 period}$$
$$+ \tfrac{1}{4} A_{Tx} A_{TST} \hat{\alpha}_e \sin\left(\alpha_{Tx} - 2\pi \tfrac{k}{8} - \varphi_e\right) \quad \rightarrow \text{Error component}$$
$$\text{with 1 period}$$
$$+ \tfrac{1}{4} A_{Tx} A_{TST} \hat{\alpha}_e \sin\left(\alpha_{Tx} + 6\pi \tfrac{k}{8} + \varphi_e\right) \quad \rightarrow \text{Error component}$$
$$\text{with 3 periods}$$

A DFT applied on these SADC values produces:

$$SADC[k] = \tfrac{1}{2} A_{Tx} A_{TST} \cos\left(\alpha_{Tx} + 2\pi \tfrac{k}{8}\right) \quad \rightarrow 4 A_{Tx} A_{TST} \cdot \quad (47)$$
$$e^{i\alpha_{Tx}} \quad \text{bin 1}$$
$$+ \tfrac{1}{4} A_{Tx} A_{TST} \hat{\alpha}_e \sin\left(\alpha_{Tx} - 2\pi \tfrac{k}{8} - \varphi_e\right) \quad \rightarrow 2 A_{Tx} A_{TST} \hat{\alpha}_e \cdot \quad \text{at}$$
$$e^{i(\varphi_e - \alpha_{Tx} + \tfrac{\pi}{2})} \quad \text{bin 1}$$
$$+ \tfrac{1}{4} A_{Tx} A_{TST} \hat{\alpha}_e \sin\left(\alpha_{Tx} + 6\pi \tfrac{k}{8} + \varphi_e\right) \quad \rightarrow 2 A_{Tx} A_{TST} \hat{\alpha}_e \cdot \quad \text{at}$$
$$e^{i(\varphi_e + \alpha_{Tx} - \tfrac{\pi}{2})} \quad \text{bin 3}$$

An inspection of this results shows that bin 3 has the same magnitude as the error component in bin 1 and that bin 3 contains the phase error $\varphi_e$ in its phase. Thus, the error component in bin 3 can be used to estimate the error component in bin 1. The monitor circuit is configured to compensate the error component in bin 1 to obtain the true phase $\alpha_{Tx}$.

A coarse summary of the proposed algorithm includes: make a rough estimate the phase of the transmitter monitoring signal $\alpha_{Tx}$ (e.g., using the transmitter monitoring signal and the phase-shifted signal); use $\alpha_{Tx}$ and bin 3 to estimate the start phase of the phase error $\varphi_e$; use the start phase of the phase error $\varphi_e$ to compensate the error component at bin 1 such that the phase of the compensated bin 1 approximately matches the optimal phase of the transmitter monitoring signal $\alpha_{Tx}$.

Figure 21:
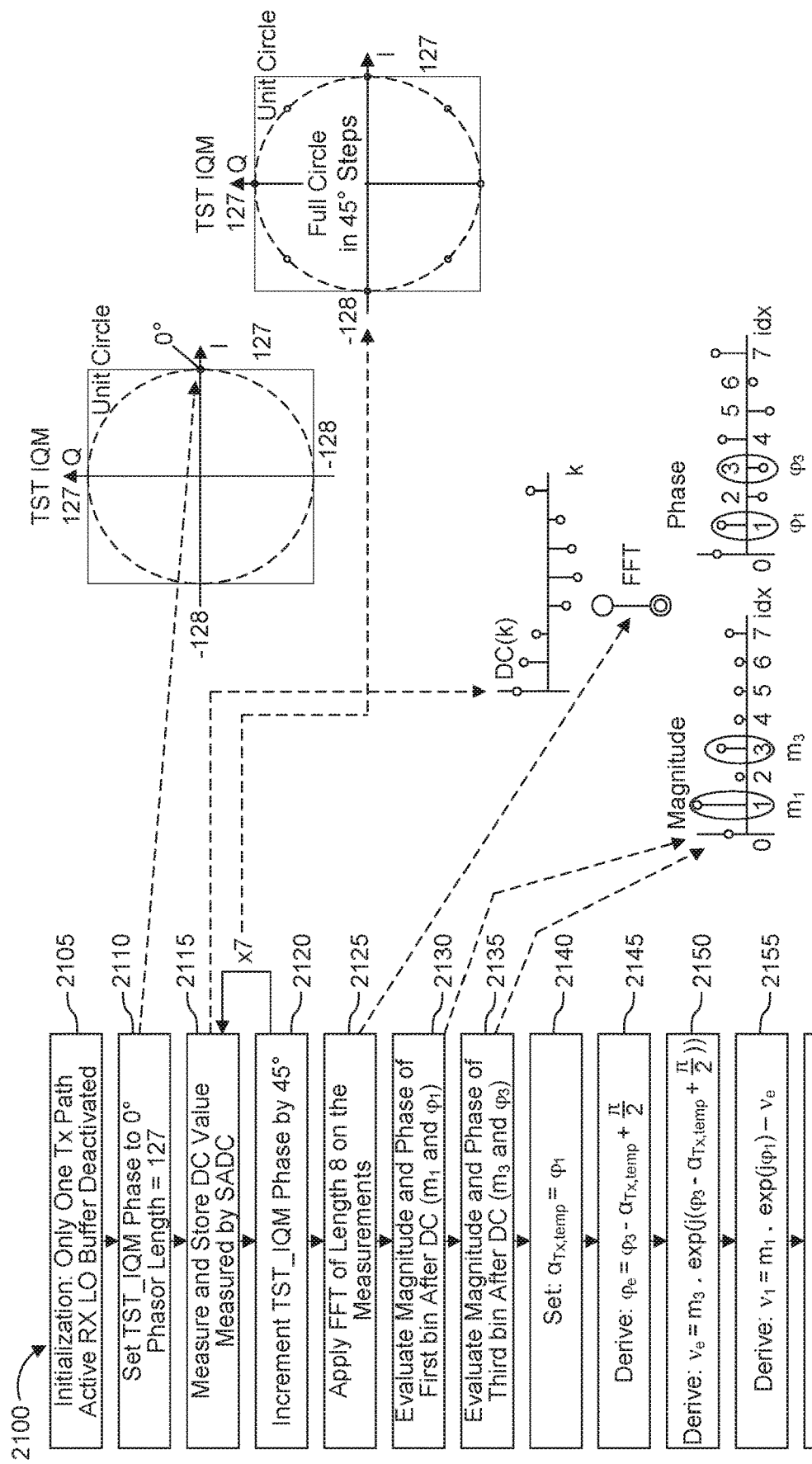
FIG. 21 illustrated a flow diagram of transmission phase compensation method 2100 according to one or more embodiments.

FIG. 21 illustrates a flow diagram of transmission phase compensation method 2100 according to one or more embodiments. In particular, FIG. 21 illustrates a flow diagram on the left, with the operation sequence indicated by solid arrows. In addition, FIG. 21 illustrates corresponding examples of some of the operations on the right, indicated by dashed arrows that originate from the corresponding operation. The method of measuring a transmission phase to derive compensated phase information $\alpha_{Tx}$ is described as follows.

The transmission phase compensation method 2100 includes initializing only one Tx path (i.e., one transmission channel) to be active, while the Rx LO buffer is deactivated (operation 2105) and setting the phase of the phase shifter 106 to 0° and a phasor length to 127 (operation 2110). The method 2100 further includes measuring and storing a DC value measured by the SADC 31 (operation 2115), incrementing the phase of the phase shifter by 45° (operation 2120), and repeating operations 2115 and 2120 seven times to acquire DC samples over one full period 2π. As a result, a sequence of eight DC sample values is acquired in this example. The method 2100 further includes applying an FFT of length 8 on the stored measurements (operation 2125), evaluating the magnitude ($m_1$) and the phase ($\varphi_1$) of the first FFT bin that follows the DC FFT bin (operation 2130), and evaluating the magnitude ($m_3$) and the phase ($\varphi_3$) of the third FFT bin that follows the DC FFT bin (operation 2135).

The method 2100 further includes a sequence of mathematical operations that use the magnitude ($m_1$), the phase ($\varphi_r$), the magnitude ($m_3$), and the phase ($\varphi_3$) to derive the compensated phase information $\alpha_{Tx}$. Thus, the method 2100 includes using the phase of the first bin $\varphi_i$ as a first order estimate of the phase of the transmitter monitoring signal $\alpha_{Tx,temp}$ (operation 2140). This is required to derive the phase error term $$\varphi_e = \left(\varphi_3 - \alpha_{Tx,temp} + \frac{\pi}{2}\right)$$

based on eq. (47) (operation 2145), and use the phase error $\varphi_e$ and the magnitude $m_3$ to derive an error approximation value $$v_e = m_3 \cdot \exp\left(j\left(\varphi_e - \alpha_{Tx,temp} + \frac{\pi}{2}\right)\right)$$

(operation 2150). The error approximation value $v_e$ and the magnitude $m_1$ and phase $\varphi_i$ are then used to derive a compensated complex value for the first bin $v_1 = m_1 \cdot \exp(j\varphi_1) - v_e$ (operation 2155), and derive an angle of the complex value $v_1$, where $\alpha_{Tx} = \text{angle}(v_1)$ (operation 2160), thus outputting the angle $\alpha_{Tx}$ as the compensated phase information to, for example, the control circuit 120 (operation 2165).

Thus, each DFT or FFT bin value includes a phase value and a magnitude value, and the monitor circuit 150 is configured to use the phase value and the magnitude value from the first DFT bin and the third DFT bin to calculate the compensated phase information. In particular, the monitor circuit 150 is configured to derive a first value $v_e$ based on the magnitude of the third bin $m_3$, the phase of the third bin $\varphi_3$, and the phase of the first bin $\varphi_1$ as an approximate value for $\alpha_{Tx,temp}$ (eq. 47). The monitor circuit 150 is configured to calculate a complex value based on the magnitude value $m_1$ from the first DFT bin, the magnitude value $m_3$ from the third DFT bin, and the first value $v_e$. The monitor circuit 150 is further configured to use an angle of the complex value $v_1$ to calculate the compensated phase information. In particular, the compensated information $\alpha_{Tx}$ coincides with vi phase, as shown in steps 2160-2165 of FIG. 21.

A possible disadvantage of the proposed method is that the phase shifter 106 not only features a 2-period phase error due to magnitude/phase mismatch but also a 4-period phase error due to a saturation of the VGAs 1803 and 1805. When evaluating the effects of such a 4-period phase error in the same way as was done for the 2-period phase error (i.e., by FFT), an additional harmonic component with thirds is obtained. This third period harmonic component overlaps with the utilized third period harmonic component from FIG. 20 and may reduce the accuracy of the phase compensation method. However, the 4-period phase error of the phase shifter 106 may be reduced, and hence the impact thereof minimized, by minimizing the saturation of the VGAs 1803 and 1805. One approach for minimizing the saturation of the VGAs 1803 and 1805 is to reduce a phase length of the phase shifter 106. Another approach is to perform a rotation with more than 16 points. In this case, the 4-period phase error of phase shifter produces the same error terms at the 3rd and the 5th bin of the phase measurement. To reduce this error, the same procedure described above can be applied iteratively on the 5th and 3rd bin to correct the estimate of the 3rd bin error term (i.e., to use an error component present at the 5th bin to compensate for the error component present at the 3rd bin).

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons.

Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor" or "processing circuitry" as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A controller including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes the controller, via a computer program, to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized, and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A circuit, comprising:
a transmission channel configured to output a continuous-wave signal based on a reference signal;
a transmit monitoring signal path configured to couple out a portion of the transmit signal as a transmit monitoring signal;
a test phase shifter configured to receive the reference signal and generate a phase-shifted signal based on a phase offset from a sequence of phase offsets applied to the received reference signal;
a phase mixer configured to mix the phase-shifted signal and the transmit monitoring signal to generate a mixer output signal comprising a plurality of direct current (DC) values;
an analog-to-digital converter (ADC) configured to sample the mixer output signal in order to provide a sequence of DC sample values, wherein each of the sequence of DC sample values corresponds to one phase offset of the sequence of phase offsets; and
a monitor circuit configured to apply a discrete Fourier transform (DFT) to the sequence of DC sample values to generate a plurality of DFT bins with corresponding DFT bin values, and generate compensated phase information of the transmission channel using at least two DFT bin values.

2. The circuit of claim 1, wherein the at least two DFT bin values include a first harmonic component of the sequence of DC sample values located at a first DFT bin that follows a DC DFT bin and a third harmonic component of the sequence of DC sample values located at a third DFT bin that follows the DC DFT bin.

3. The circuit of claim 2, wherein the first DFT bin is located adjacent to and between the DC DFT bin and a second DFT bin, and the third DFT bin is located adjacent to and between the second DFT bin and a fourth DFT bin.

4. The circuit of claim 2, wherein the first harmonic component includes a measurement component and a first error component of the sequence of DC sample values and the third harmonic component includes a second error component of the sequence of DC sample values, the second error component being related to the first error component based on a predefined relationship.

5. The circuit of claim 4, wherein the monitor circuit is configured to measure the second error component to derive the first error component based on the predefined relationship, and subtract the first error component from the first harmonic component to generate the compensated phase information.

6. The circuit of claim 2, wherein the third harmonic component is an error component caused by a 2-period error introduced by the test phase shifter.

7. The circuit of claim 1, wherein:
the transmission channel includes a transmission phase shifter, and
the circuit further comprises a control circuit configured to receive the compensated phase information and adjust a phase-shift setting of the transmission phase shifter based on the compensated phase information.

8. The circuit of claim 2, wherein:
each DFT bin value includes a phase value and a magnitude value, and
the monitor circuit is configured to use the phase value and the magnitude value from the first DFT bin and the third DFT bin to calculate the compensated phase information.

9. The circuit of claim 8, wherein:
the monitor circuit is configured to derive a first value based on the magnitude value of the third DFT bin, the phase value of the third DFT bin, and the phase value of the first DFT bin, use the first value to calculate a complex value, and use an angle of the complex value to derive the compensated phase information.

10. The circuit of claim 9, wherein:
the monitor circuit is configured to calculate the complex value based on the magnitude value from the first DFT bin, the magnitude value from the third DFT bin, and the first value.

11. The circuit of claim 1, wherein the sequence of DC sample values have a sinusoidal pattern.

12. The circuit of claim 1, wherein the test phase shifter is an I/Q modulator.

13. The circuit of claim 1, wherein the phase shifter introduces a 2-period phase error into the phase-shifted signal.

14. The circuit of claim 1, wherein each of the plurality of DC values correspond to a different phase offset of the sequence of phase offsets.

15. The circuit of claim 14, wherein the sequence of phase offsets is a stepwise rotation of a phase offset over one full rotation of $2\pi$.

16. A method of measuring a transmission phase, the method comprising:
   outputting a continuous-wave signal from a transmission channel based on a reference signal;
   coupling out a portion of the transmit signal as a transmit monitoring signal;
   generating a phase-shifted signal based on a phase offset from a sequence of phase offsets applied to the reference signal;
   mixing the phase-shifted signal and the transmit monitoring signal to generate a mixer output signal comprising a plurality of direct current (DC) values;
   sampling the mixer output signal in order to provide a sequence of DC sample values, wherein each of the sequence of DC sample values corresponds to one phase offset of the sequence of phase offsets;
   applying a discrete Fourier transform (DFT) to the sequence of DC sample values to generate a plurality of DFT bins with corresponding DFT bin values; and
   generating compensated phase information of the transmission channel based on at least two DFT bin values.

17. The method of claim 16, wherein the at least two DFT bin values include a first harmonic component of the sequence of DC sample values located at a first DFT bin that follows a DC DFT bin and a third harmonic component of the sequence of DC sample values located at a third DFT bin that follows the DC DFT bin.

18. The method of claim 17, wherein the first DFT bin is located adjacent to and between the DC DFT bin and a second DFT bin, and the third DFT bin is located adjacent to and between the second DFT bin and a fourth DFT bin.

19. The method of claim 17, wherein the first harmonic component includes a measurement component and a first error component of the sequence of DC sample values and the third harmonic component includes a second error component of the sequence of DC sample values, the second error component being related to the first error component based on a predefined relationship.

20. The method of claim 19, wherein generating the compensated phase information of the transmission channel comprises:
   measuring the second error component;
   deriving the first error component based on the measured second error component and the predefined relationship; and
   subtracting the first error component from the first harmonic component to generate the compensated phase information.

21. The method of claim 16, further comprising:
   adjusting a phase-shift setting of a transmission phase shifter of the transmission channel based on the compensated phase information.

22. A method of calibrating an IQ modulator, the method comprising:
   generating a continuous-wave signal based on a continuous-wave reference signal;
   generating a sequence of phase-shifted signals based on a sequence of phase offsets applied to the reference signal;
   mixing the sequence of phase-shifted signals and the continuous-wave signal to generate a sequence of mixer output signals;
   sampling the sequence of mixer output signals;
   determining a sequence of DC sample values from the sequence of mixer output signals, wherein each DC sample value of the sequence of DC sample values corresponds to one phase offset of the sequence of phase offsets;
   applying a discrete Fourier transform (DFT) to the sequence of DC sample values to generate a plurality of DFT bins with corresponding DFT bin values; and
   generating IQ modulator calibration information based on at least two DFT bin values.

* * * * *